United States Patent
Yamazaki et al.

(10) Patent No.: US 6,706,544 B2
(45) Date of Patent: Mar. 16, 2004

(54) LIGHT EMITTING DEVICE AND FABRICATING METHOD THEREOF

(75) Inventors: Shunpei Yamazaki, Kanagawa (JP); Takeshi Fukunaga, Kanagawa (JP); Jun Koyama, Kanagawa (JP); Kazutaka Inukai, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 72 days.

(21) Appl. No.: 09/837,324

(22) Filed: Apr. 19, 2001

(65) Prior Publication Data

US 2002/0048829 A1 Apr. 25, 2002

(30) Foreign Application Priority Data

Apr. 19, 2000 (JP) ......................... 2000-117436

(51) Int. Cl.⁷ .............................................. H01L 21/00
(52) U.S. Cl. ........................... 438/30; 438/23; 438/24; 438/152; 438/155; 438/156; 438/162; 438/163; 438/164
(58) Field of Search ................ 438/149, 151, 438/152, 155, 156, 162, 163, 164, 23, 24, 30

(56) References Cited

U.S. PATENT DOCUMENTS

| | | |
|---|---|---|
| 4,963,504 A | 10/1990 | Huang et al. |
| 5,182,619 A | 1/1993 | Pfiester |
| 5,543,340 A | 8/1996 | Lee |

(List continued on next page.)

FOREIGN PATENT DOCUMENTS

| | | |
|---|---|---|
| JP | 06-148685 | 5/1994 |
| JP | 07-130652 A | 5/1995 |
| JP | 07-235680 | 9/1995 |
| JP | 08-096959 A | 4/1996 |
| JP | 08-274336 | 10/1996 |
| JP | 09-063770 A | 3/1997 |
| JP | 410268347 | * 10/1998 |
| JP | 11-338786 A | 12/1999 |
| JP | 2002050765 A | * 2/2002 |

OTHER PUBLICATIONS

Tsutsui et al., "Electroluminescence in Organic Thin Films", Photochemical Processes in Organized Molecular Systems, 1991, pp. 437–450.

M. A. Baldo et al., "Highly Efficient Phosphorescent Emission from Organic Electroluminescent Devices", Nature vol. 395, Sep. 10, 1998, pp. 151–154.

M. A. Baldo et al., "Very High–Efficiency Green Organic Light–Emitting Devices Based on Electrophosphorescence", Applied Physics Letters vol. 75, No. 1, Jul. 5, 1999, pp.4–6.

Specification and Drawings of U.S. patent application Ser. No. 09/837,324, Inventor: Shunpei Yamazaki et al., Filed: Apr. 12, 2001.

Specification and Drawings of U.S. patent application Ser. No. 09/832,867, Inventor: Shunpei Yamazaki et al., Filed: Apr. 12, 2001.

Primary Examiner—Long Pham
(74) Attorney, Agent, or Firm—Nixon Peabody LLP; Jeffrey L. Costellia

(57) ABSTRACT

The light emitting device according to the present invention is characterized in that a gate electrode comprising plurality of conductive films is formed, and concentration of impurity regions in an active layer are adjusted with making use of selectivity of the conductive films in etching and using them as masks. The present invention reduces the number of photolithography steps in relation to manufacturing the TFT for improving yield of the light emitting device and shortening manufacturing term thereof, by which a light emitting device and an electronic appliance are inexpensively provided.

44 Claims, 19 Drawing Sheets

U.S. PATENT DOCUMENTS

| | | |
|---|---|---|
| 5,581,092 A | 12/1996 | Takemura |
| 5,583,067 A | 12/1996 | Sanchez |
| 5,643,826 A | 7/1997 | Ohtani et al. |
| 5,767,930 A | 6/1998 | Kobayashi et al. |
| 5,841,170 A | 11/1998 | Adan et al. |
| 5,923,961 A | 7/1999 | Shibuya et al. |
| 5,923,962 A | 7/1999 | Ohtani et al. |
| 6,001,714 A * | 12/1999 | Nakajima et al. |
| 6,031,290 A | 2/2000 | Miyazaki et al. |
| 6,323,070 B1 * | 11/2001 | Yamazaki |
| 6,335,290 B1 * | 1/2002 | Ishida |
| 6,365,917 B1 * | 4/2002 | Yamazaki |
| 2001/0052950 A1 | 12/2001 | Yamazaki et al. |
| 2002/0000551 A1 | 1/2002 | Yamazaki et al. |

* cited by examiner

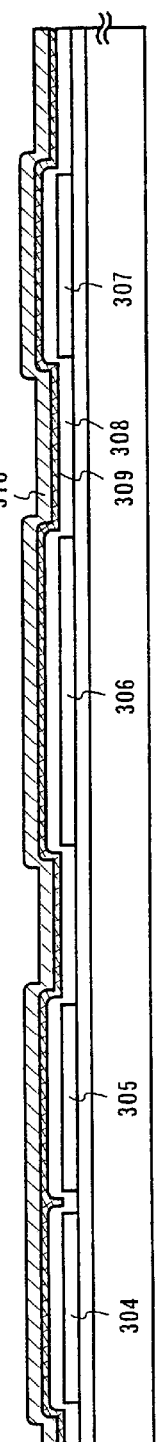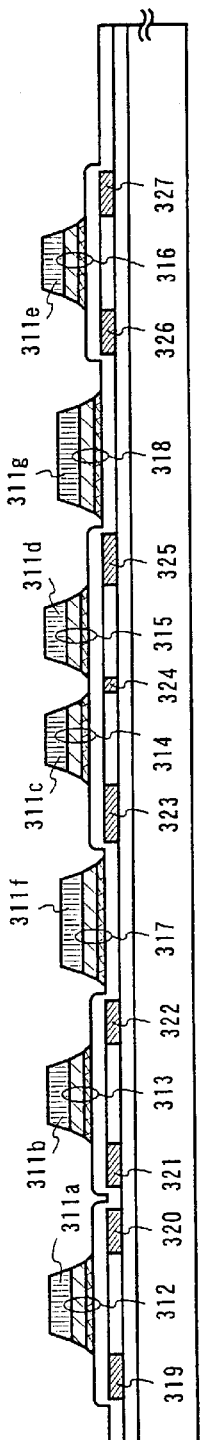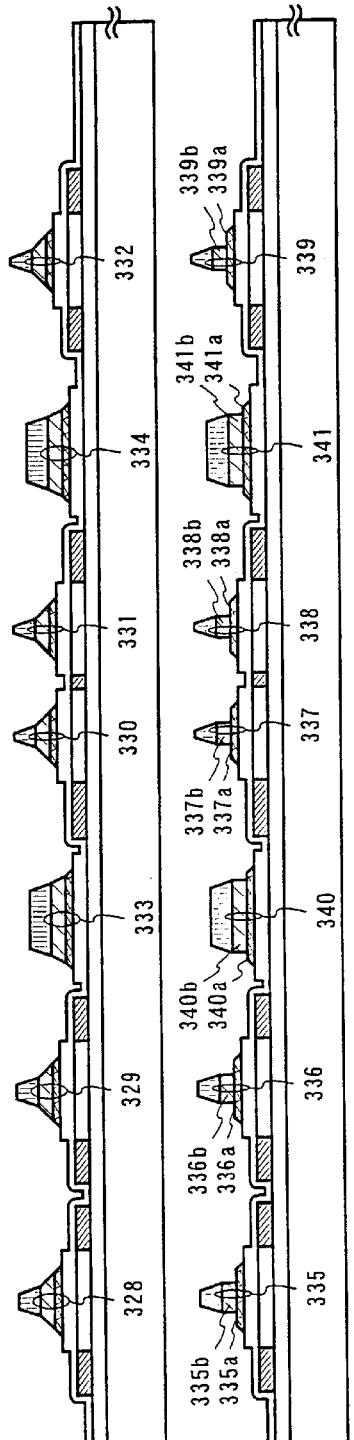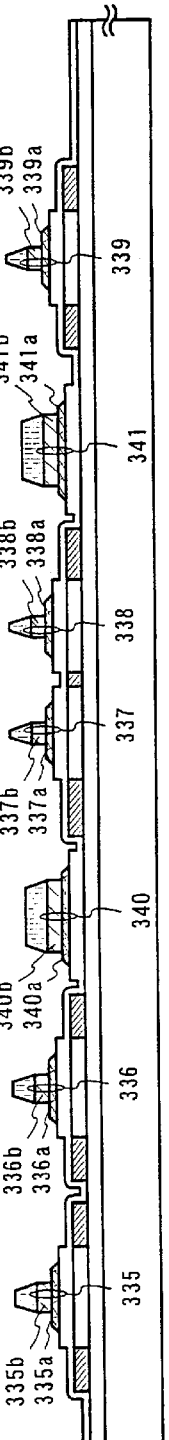

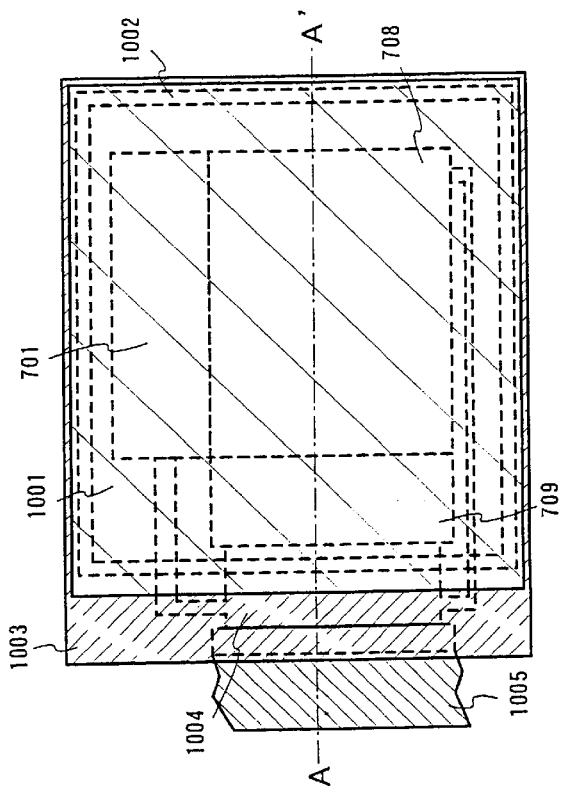
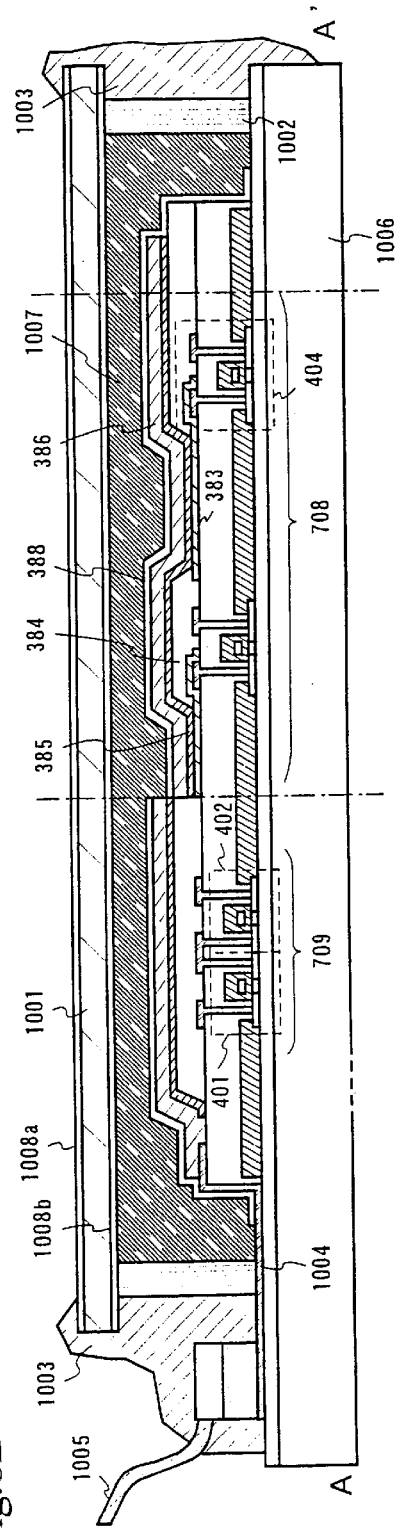
Fig.8A
Fig.8B

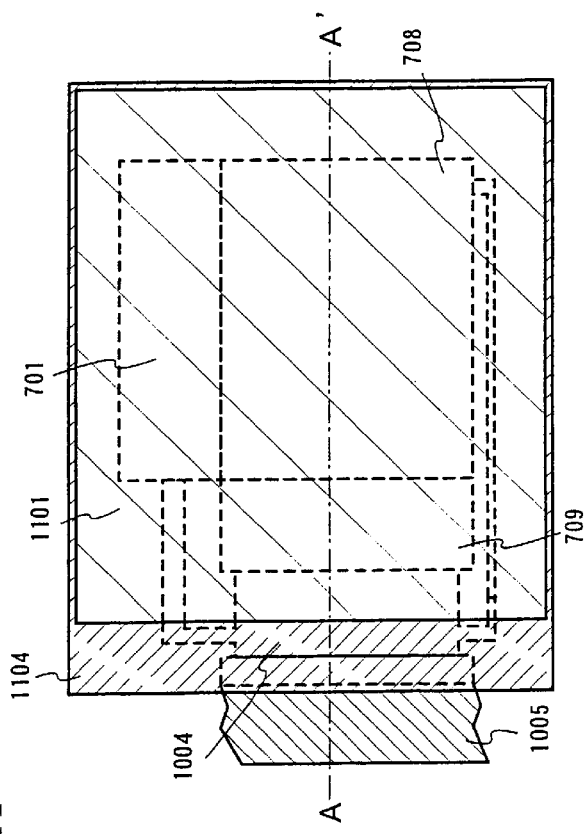
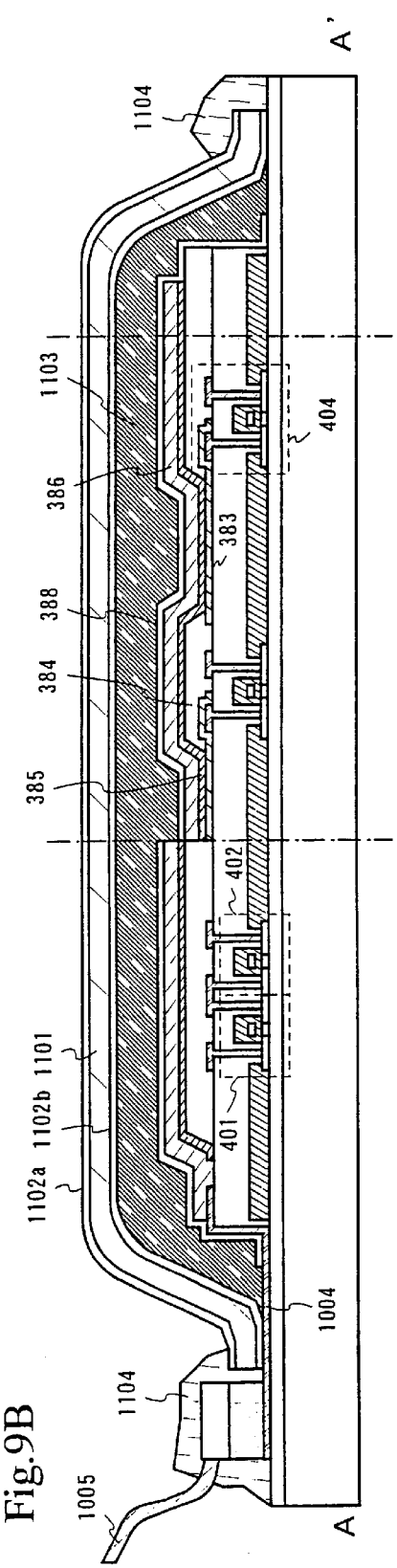
Fig.9A
Fig.9B

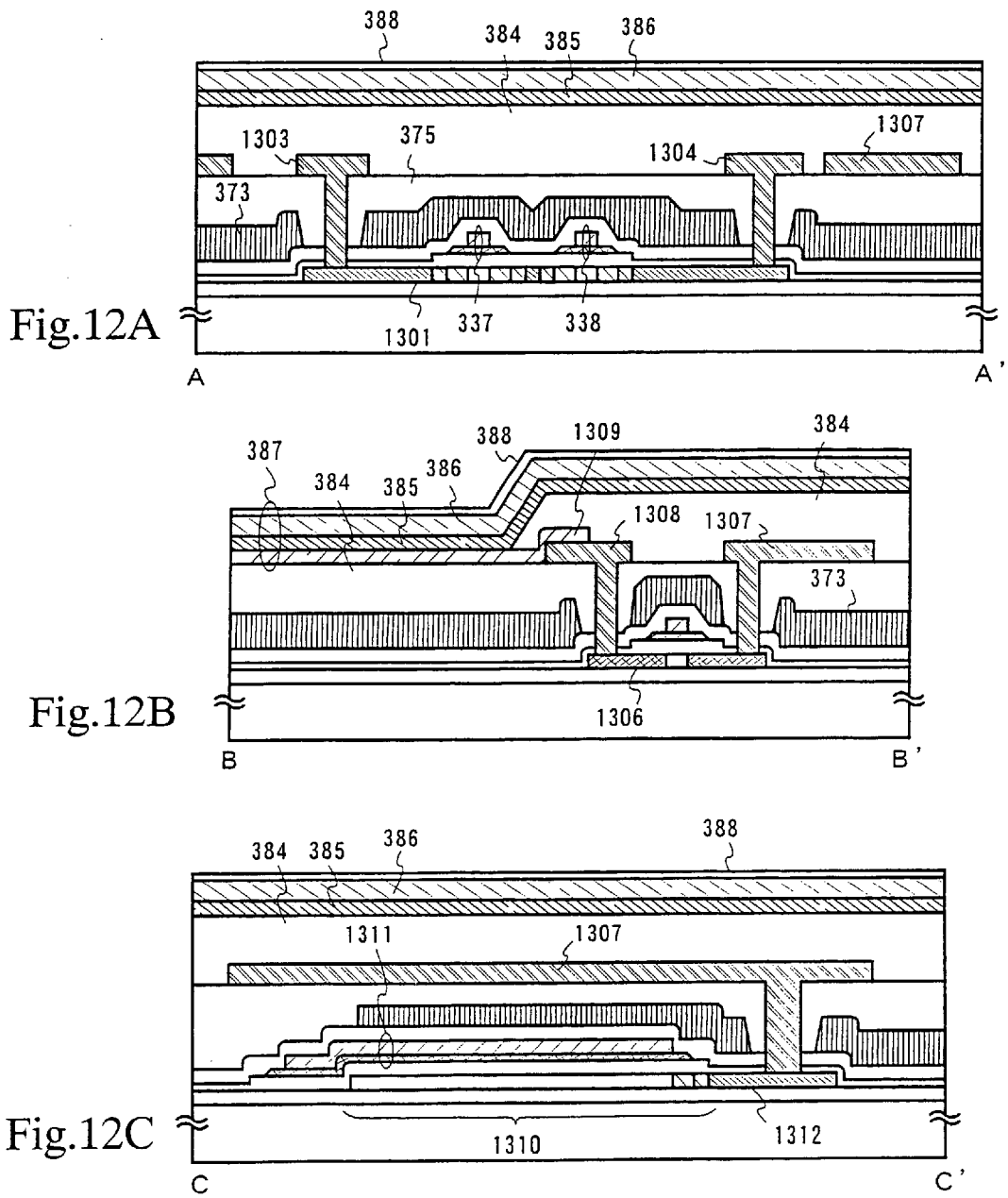

LIGHT EMITTING DEVICE AND FABRICATING METHOD THEREOF

BACKGROUND OF THE INVENTION

1. Field of the Invention

The present invention relates to a light emitting device which has an element with a luminescent material put between electrodes, a manufacturing method thereof, and an electronic appliance using the light emitting device for the display (an indication display or a displaying monitor), particularly to a light emitting device using a luminescent material by which EL (Electro Luminescence) can be obtained (hereinafter referred to as an EL material) and a manufacturing method thereof. The light emitting device according to the present invention includes an organic EL display and an OLED (Organic Light Emitting Diode).

The luminescent material that can be used in the present invention includes all of materials which emit light (phosphorescence and/or fluorescence) through singlet excitation, triplet excitation, or both.

2. Description of the Related Art

Recently, there has been proceeding development of light emitting devices (hereinafter referred to as EL light emitting devices) using self-light emitting elements (hereinafter referred to as EL elements) to which EL phenomenon of luminescent materials is applied. The EL light emitting devices, being display devices using self-light emitting elements, necessitate no back-lighting as in liquid crystal display devices. Furthermore, with their wide viewing angles, the EL light emitting devices attract attention for being used as displays of portable units used outdoors.

There are two types of the EL light emitting device, i.e. an active matrix type and a passive matrix type there has been development of both types actively carried out. At present, the active matrix type EL light emitting device is particularly noted. The active matrix type EL light emitting device is characterized in that a thin film transistor (hereinafter referred to as TFT) is provided for each of pixels of a pixel section to control an amount of current flowing in an EL element.

The advantage of the active matrix type is that a highly fine image can be displayed and an image with larger amount of information can be provided.

However, it makes a manufacturing process complicated to provide the TFT for each of the pixels, and there are caused problems of reduction in yield and increase in manufacturing cost due to a protracted manufacturing term. In particular, many photolithography steps cause remarkable reduction in yield, and reduction in number of photolithography steps was an important subject.

SUMMARY OF THE INVENTION

In view of the above-mentioned problem, it is an object of the present invention to provide an inexpensive light emitting device and a manufacturing method thereof, for which the number of photolithography steps is reduced for improving yield and shortening manufacturing term to reduce manufacturing cost. In addition, it is another object of the present invention to provide an inexpensive electronic appliance for which an inexpensive light emitting device is used as a display.

In order to achieve the above objects, the light emitting device according to the present invention is characterized with a gate electrode comprising a plurality of layers each with a different kind of conductive film, and the conductive films with respectively different thicknesses are provided by making use of their selectivity in etching and are used as masks for adjusting concentrations of impurity regions formed in an active layer. The above reduces the number of photolithography steps in relation to manufacturing the TFT for improving yield of the light emitting device and shortening manufacturing term thereof.

A typical manufacturing process of an n-channel TFT which characterizes the present invention will be explained with reference to FIGS. 1A through 1E. In FIG. 1A, reference numeral denotes an insulator 100, which is a substrate provided with an insulating film thereon, an insulating substrate, or an insulating film. On the insulator 100, there is formed a semiconductor film (typically a silicon film) 101 which becomes an active layer of the TFT. The semiconductor film 101 is covered with an insulating film 102 containing silicon, which film becomes a gate insulating film of the TFT. For the insulating film containing silicon, silicon oxide film, silicon nitride film, silicon oxynitride film, or a laminated film of combination of them can be used.

Next, on the insulating film 102 containing silicon, there is formed a first conductive film 103 and a second conductive film 104. Here, it is important that the first conductive film 103 and the second conductive film 104 are allowed to have selectivity to each other in etching. Specifically, it can be said that it is important that there is an etching condition under which the second conductive film 104 can be etched with the first conductive film 103 being left.

Typical combination of the first conductive film 103 and the second conductive film 104 are listed as 1) the combination of a tantalum nitride film as the first conductive film and a tungsten film as the second conductive film, 2) the combination of a tungsten film as the first conductive film and an aluminum film as the second conductive film, or 3) the combination of a titanium nitride as the first conductive film and a tungsten film as the second conductive film.

In the above combination of 1), the tungsten film and the tantalum nitride film are etched by a combination of chlorine ($Cl_2$) gas and carbon tetrafluoride ($CF_4$) gas. By adding oxygen ($O_2$) gas to the gasses with the combination an etching rate of the tantalum nitride film is extremely reduced to allow to provide selectivity for the conductive films.

Moreover, in the above combination of 2), with the combination of bromine trichloride ($BrCl_3$) gas and chlorine ($Cl_2$) gas, an aluminum film is etched and a tungsten film is not. Furthermore, with the combination of chlorine ($Cl_2$) gas and carbon tetrafluoride ($CF_4$) gas, a tungsten film is eched, but an aluminum film is not. In this way, selectivity can be provided for both of the conductive films.

Next, as shown in FIG. 1B, the first conductive film 103 and the second conductive film 104 are etched by using a resist mask 105 to form a gate electrode 106. Here, a gate electrode obtained by etching the first conductive film is to be referred to as a first gate electrode, and a gate electrode obtained by etching the second conductive film is to be referred to as a second gate electrode. Therefore the gate electrode 106 comprises the first electrode 106a and the second gate electrode 106b.

The gate electrode 106 is preferably formed in a tapered shape with an etching condition. Being tapered is that an edge face of the electrode has an inclined part with an angle between the edge face and the under film which is referred to as a tapered angle. To be formed in the tapered shape is that the electrode is formed in a shape with edges each being inclined with a tapered angle. A trapezoid is included in a tapered shape.

In forming the gate electrode 106, the gate insulating film 102 is also etched slightly to be a little thinned. The thinning is preferably restrained within 20 to 50 nm although it is differed depending on etching conditions.

In this state, an impurity element (hereinafter referred to as n-type impurity element) is added into the semiconductor film 101 for making the semiconductor an n-type semiconductor. At this time, the gate electrode 106 is used as a mask to add the n-type impurity element to the semiconductor film 101 in being self-aligned. As a specific n-type impurity, an element which belongs to group fifteen in the periodic table (typically phosphorus or arsenic) can be used.

A well-known plasma doping method or an ion implantation method can be used as the method for addition. The impurity element can be added to the semiconductor film in concentrations from $1\times10^{20}$ to $1\times10^{21}$ atoms/cm$^3$. Each of regions 107 and 108 with addition of an n-type impurity element in such concentrations is to be referred to as an n-type impurity region (a).

In the next, as shown in FIG. 1C, the gate electrode 106 is further etched under the same condition as that of forming the gate electrode 106. Then a gate electrode 109 is formed with further thinned width (the gate electrode 109 comprises a first gate electrode 109a and a second gate electrode 109b). At this time, there is the progress of thinning of the gate insulating film 102.

While the etching step shown in FIG. 1C is carried out, the etching condition is changed so as to allow the second gate electrode 109b to be selectively etched. Parameters such as the etching gas, substrate bias voltage, and electric power applied to electrodes, may be changed. Here, since it is necessary only to conserve selectivity between the first gate electrode 109a and the second gate electrode 109b, the easiest way therefore is to change the etching gas.

Thus, as shown in FIG. 1D, a gate electrode 111 is formed which comprises the first gate electrode 109a and a second gate electrode 110.

In this state, the doping step with the n-type impurity element is carried out again. The doping step is carried out with a higher acceleration voltage than that in the step shown in FIG. 1B so that the impurity element can reach deep location. At this time, regions denoted by reference numerals 112 and 113 are doped with an n-type impurity element in concentrations from $1\times10^{17}$ to $1\times10^{19}$ atoms/cm$^3$. Each of the regions 112 and 113 doped with the n-type impurity element in such concentrations is to be referred to as an n-type impurity region (b).

Moreover, regions denoted by reference numerals 114 and 115 are also doped with the n-type impurity element each through an end portion of the first gate electrode 109a (a portion without being in contact with the second gate electrode 110). Therefore, concentrations of the n-type impurity element in the regions 114 and 115 are lower than those in the n-type impurity region (b) (preferably in from $1\times10^{16}$ to $5\times10^{18}$ atoms/cm$^3$). Each of the regions 114 and 115 doped with the n-type impurity element in such concentrations is to be referred to as an n-type impurity region (c).

A region 116 which is not doped with the n-type impurity element is a region which functions as a channel forming region of the TFT, and is formed directly below the gate electrode 110.

Thereafter, as shown in FIG. 1E, a passivation film 117, an interlayer insulating film 118, a source wiring 119 and a drain wiring 120 are formed to complete formation of the n-channel TFT. As the passivation film 117, a silicon nitride film or a silicon oxide nitride film can be used. As the interlayer insulation film 118, an inorganic insulating film, an organic insulating film, or a lamination film of them can be used. A resin film such as polyimide, acrylic resin, polyamide, or BCB (benzocyclobutene) can be used as the organic insulating film. Further, as the source wiring 119 and the drain wiring 120, known conductive films can be used.

In the above manufacturing process, there are only four times of the photolithography steps, which are each carried out when the semiconductor film 101 is formed, the gate electrode 106 is formed, contact holes in the interlayer insulating film are formed, and the source wiring and the drain wiring. In forming a CMOS circuit, an additional photolithography step is required for manufacturing a p-channel TFT. Nevertheless, this requires only five times of the photolithography steps.

The TFT shown in FIG. 1E has the n-type impurity region (b) 113 and the n-type impurity region (c) 115 which are formed between the channel forming region 116 and the drain region 108. Here, the n-type impurity region (c) 115 and the first gate electrode 109a with the gate insulating film 102 therebetween. The structure is very effective in preventing hot carrier deterioration. Moreover, the n-type impurity region (b) 113 is a region with acting like a conventional LDD (light-doped drain).

Therefore, in the TFT shown in FIG. 1E, it is a means for preventing hot carrier to provide the n-type impurity region (c) and it is a means for preventing leak current to provide the n-type impurity region (b). Accordingly the structure with a significantly high reliability is provided. The present invention allows such a highly reliable TFT to be manufactured only with five times photolithography steps. This makes it possible not only to improve yield and shorten the manufacturing term for the whole light emitting device including light emitting elements but also to manufacture an inexpensive and highly reliable light emitting device.

BRIEF DESCRIPTION OF THE DRAWINGS

FIG. 2A to FIG. 2E are cross sectional views showing the steps of manufacturing a pixel section and a driving circuit of an EL light emitting device according to Embodiment 1 of the present invention until gate electrodes, source wirings and drain wirings are formed;

FIG. 8A is a top view showing the EL light emitting device according to Embodiment 1 in a state after the manufacturing steps have been carried out up to that of sealing;

FIG. 8B is a view showing a cross section of the EL light emitting device cut along line A–A' shown in FIG. 8A;

FIG. 9A is a top view showing the EL light emitting device according to Embodiment 9 in a state after the manufacturing steps have been carried out up to that of sealing;

FIG. 9B is a view showing a cross section of the EL light emitting device cut along line A–A' shown in FIG. 9A;

FIG. 12A is a view of a cross section cut along line A–A' in FIG. 1 showing a structure of a switching TFT in the pixel section;

FIG. 12B is a view of a cross section cut along line B–B' in FIG. 11 showing a structure of a current controlling TFT in the pixel section;

FIG. 12C is a view of a cross section cut along line C–C' in FIG. 11 showing a structure of a holding capacitor in the pixel section;

DESCRIPTION OF THE PREFERRED EMBODIMENTS

Figure 1A:
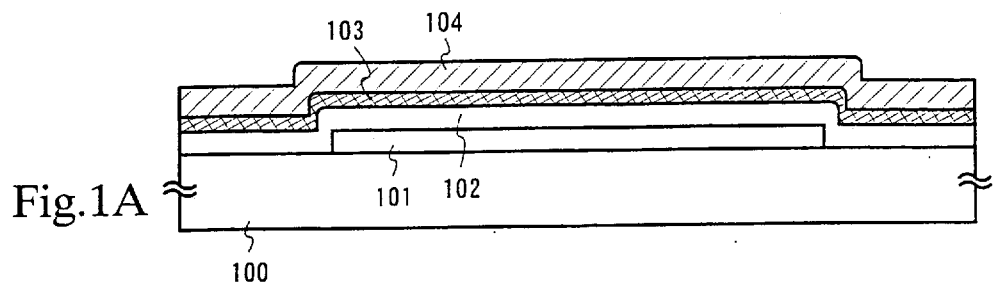
FIG. 1A to FIG. 1E are cross sectional views each showing typical step of manufacturing an n-channel TFT according to the present invention.
Figure 1B:
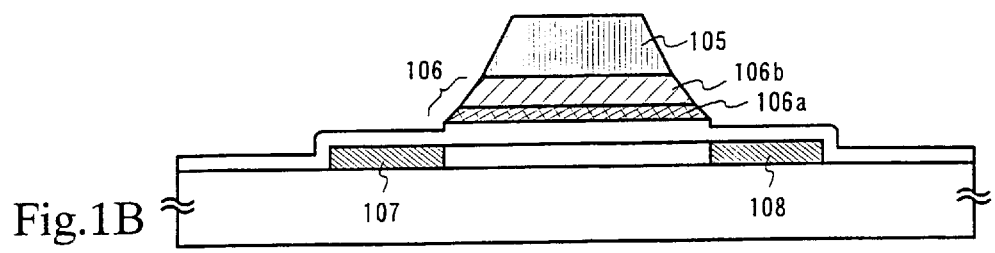
Figure 1C:
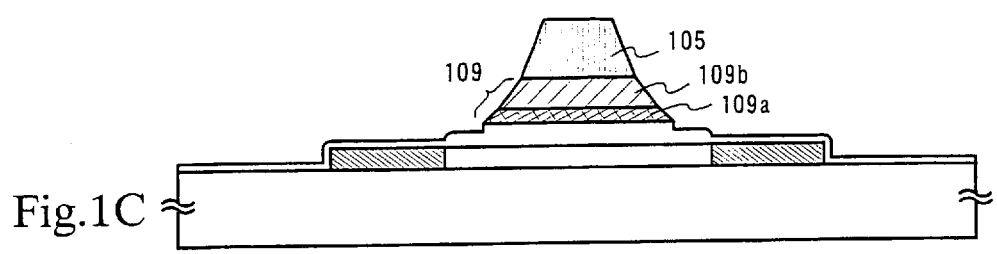
Figure 1D:
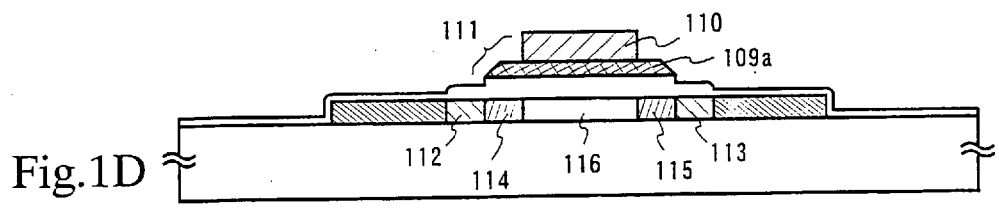
Figure 1E:
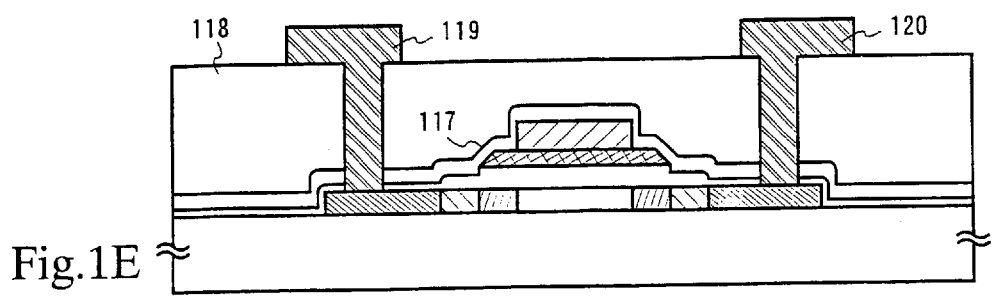

Preferred embodiments of the present invention will be explained in detail below.

EMBODIMENT 1

An embodiment 1 according to the present invention will be explained with reference to FIG. 2A through FIG. 4B. Here, an explanation will be made about a method of simultaneously manufacturing a TFT of a pixel portion and a TFT of a driver circuit provided in the periphery of the pixel portion. For simplifying the explanation a CMOS circuit as a basic unit of the circuit will be shown with respect to driver circuit.

First, as shown in FIG. 2A, a base film 302 is formed of a thickness of 300 nm on a glass substrate 301. In the embodiment 1, silicon oxynitride films are laminated for being used as the base film 302. At this time, nitrogen concentrations in the base film 302 on the side in contact with the glass substrate 301 are better taken as 10 to 25 wt %.

It is effective for the base film 302 to be provided with a heat dissipation effect. Thus, a carbon film, in particular a DLC (diamond-like carbon) film, is effectively provided on each or either side of the substrate 301. The DLC film can be deposited by a CVD method or a sputtering method, and there is the advantage that the deposition is possible at temperatures ranging from the room temperature to 100° C. or less.

Next, on the base film 302, a film of amorphous silicon (not shown) is formed with a thickness of 50 nm by a known deposition method. The film is not limited to the amorphous silicon film, and can be a semiconductor film including an amorphous structure (including a microcrystalline semiconductor film). Furthermore, the film can be a compound semiconductor film including the amorphous structure such as an amorphous silicon germanium film. The film thickness can be 20 to 100 nm.

Then, the amorphous silicon film is crystallized by the method disclosed in JP-A-7-130652 to form a crystalline silicon film (referred to as a polycrystalline silicon film or a polysilicon film) 303. In the embodiment 1, nickel is used as an element for promoting crystallization. A laser annealing method using a laser beam or a lamp annealing method using infrared light can be of course used as another method for crystallization.

Next, as shown in FIG. 2B, the crystalline silicon film 303 is etched by a first photolithography step to form island-like semiconductor films 304 to 307, which become later active layers of the TFT.

Here, in the embodiment 1, a protection film (not shown) of silicon oxide film is formed with a thickness of 130 nm on the semiconductor films 304 to 307. The semiconductor films 304 to 307 are then doped with an impurity element that makes the semiconductor a p-type semiconductor (hereinafter referred to as p-type impurity element). An element which belongs to the group thirteen (typically boron or gallium) can be used as the p-type impurity element. The protection film is provided for protecting the crystalline silicon films so as not to be directly exposed to plasma and for allowing a sensitive regulation of the impurity concentration.

The concentration of the p-type impurity element added for doping at this time can be taken as from $1 \times 10^{15}$ to $5 \times 10^{17}$ atoms/cm$^3$ (typically from $1 \times 10^{16}$ to $1 \times 10^{17}$ atoms/cm$^3$). The p-type impurity element added in the concentration is used for adjusting a threshold voltage of the TFT.

Then, a gate insulating film 308 is formed for covering the semiconductor films 304 to 307. As the gate insulating film 308, an insulating film containing silicon can be used in a thickness from 10 to 200 nm, preferably from 50 to 150 nm. The gate insulating film 308 can take either of a single layer structure and lamination structure. In the embodiment 1, an oxynitride film of 115 nm thick is used.

Next, a tantalum nitride film of a 30 nm thick is formed as a first conductive film 309 and further a tungsten film of a 370 nm thick is formed as a second conductive film 310. These metal films can be formed by a sputtering method. Addition of inert gas such as Xe and Ne to a sputtering gas can prevent separation of the film due to stress. In addition, by using a highly purified tungsten target with a purity of 99.9999%, a low resistance tungsten film can be formed with a resistivity of 20 mΩcm or less.

Then, resist masks 311a to 311g are formed for etching the first conductive film 309 and the second conductive film 310. The etching treatment carried out here is to be called as a first etching treatment.

In the embodiment 1, an etching method using ICP (Inductively Coupled Plasma) is employed. A mixed gas of carbon tetrafluoride ($CF_4$) gas and chlorine ($Cl_2$) gas is used with a deposition pressure of 1 Pa. In this state, plasma is generated with 500W of RF power (13.56 MHz) applied to a coil-shaped electrode. In addition, 150W of RF power (13.56 MHz) is applied to a stage on which the substrate mounted as a self-bias voltage so that a negative self-bias voltage is applied to the substrate.

The etching treatment carried out under such a condition provides selectivity of the tantalum nitride film and the tungsten film near 1:1 to make it possible to etch them together. Furthermore, by making use of retreating of the edges of the resist masks 311a to 311e, the first conductive film 309 and the second conductive film 310 can be etched in a tapered shape with a tapered angle from 15 to 45°. With the etching condition in the embodiment 1, a tapered angle of about 25° can be obtained.

Thus, as shown in FIG. 2C, there are formed gate electrodes 312 to 316, each being formed of a lamination film comprising the first conductive film and the second conductive film, and a source wiring 317 and a drain wiring 318 of a switching TFT. Here, the drain wirings 318 also functions a gate electrode of a current controlling TFT.

Next, with the gate electrodes 312 to 316, the source wiring 317, and the drain wiring 318 used as masks, an n-type impurity element (in the embodiment 1, phosphorus) is added in being self-aligned. In thus formed impurity regions 319 to 327 the n-type impurity element is contained in concentrations from $1 \times 10^{20}$ to $1 \times 10^{21}$ atoms/cm$^3$ (typically from $2 \times 10^{20}$ to $5 \times 10^{21}$ atoms/cm$^3$). The impurity regions 319 to 327 form source regions and drain regions of n-channel TFTs.

Next, the gate electrodes, the source wiring, and the drain wiring are etched using the resist masks 311a to 311g. The etching condition at this time can be same as that in the first etching treatment. Here, as shown in FIG. 2D, the tapered part of each of the gate electrodes, the source wiring, and the drain wiring is made to retreat. Accordingly, gate electrodes 328 to 332, a source wiring 333, and a drain wiring 334 are formed each of which has a thinner width than that shown in FIG. 2C.

Furthermore, as shown in FIG. 2E, the second conductive films (tungsten films) are selectively etched using the resist masks 311a to 311g. The etching condition therefor can be provided by mixing oxygen gas in the etching gas of the first etching treatment. This is because mixing oxygen gas in the etching gas makes progress of etching of the first conductive film (tantalum nitride film) extremely slow. The etching treatment carried out here is to be referred to as a second etching treatment.

At this time, there are formed gate electrodes 335 to 339 with a laminated structure comprising first gate electrodes 335a to 339a and second gate electrodes 335b to 339b, respectively. Further, there are formed a source wiring 340 with a laminated structure comprising a first source wiring 340a and a second source wiring 340b, and a drain wiring 341 with a laminated structure comprising a first drain wiring 341a and a second drain wiring 341b.

Figure 3A:
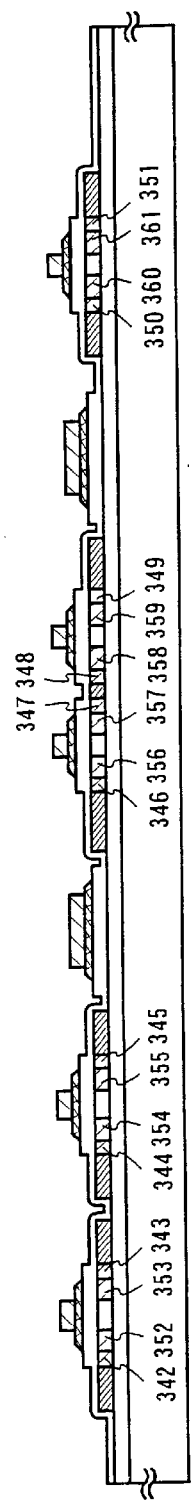
FIG. 3A to FIG. 3D are cross sectional views showing the steps of manufacturing the pixel section and the driving circuit of the EL light emitting device according to Embodiment 1 subsequent to the step shown in FIG. 2E and until a coloring layer and an interlayer insulating film are formed.

Next, the resist masks 311a to 311g are removed, and an n-type impurity element (in the embodiment 1, phosphorus) is added as shown in FIG. 3A. In this step, adjustment is performed so that the n-type impurity element is contained in each of n-type impurity regions 342 to 451 in concentrations from $2 \times 10^{16}$ to $5 \times 10^{19}$ atoms/cm$^3$ (typically from $5 \times 10^{17}$ to $5 \times 10^{18}$ atoms/cm$^3$). The impurity region doped with the n-type impurity element of the above concentration is to be referred to as the n-type impurity region (b).

At this time, n-type impurity regions 352 to 361 are formed simultaneously. These impurity regions are formed with the n-type impurity element passed through the first gate electrodes 335a to 339a, and, therefore, phosphorus is added with concentrations from ½ to ¹⁄₁₀ (typically, ⅓ to ¼) of those in the n-type impurity regions 342 to 351. Specifically, the n-type impurity element is included in concentrations from $1 \times 10^{16}$ to $5 \times 10^{18}$ atoms/cm$^3$ (typically from $3 \times 10^{17}$ to $3 \times 10^{18}$ atoms/cm$^3$). The impurity region doped with the n-type impurity element in the above concentrations is to be referred to as the n-type impurity region (c).

It is necessary for the n-type impurity element to pass through the first gate electrodes 353a to 339a and the gate insulating film 308 for doping. Therefore, an acceleration voltage is set a little higher as being from 70 to 120 kV (in the embodiment 1, 90 kV).

Figure 3B:
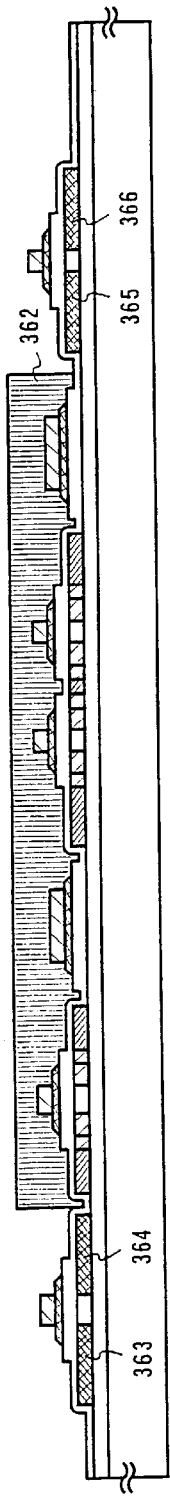

Next, as shown in FIG. 3B, a resist mask 362 is formed. Then, a p-type impurity element (in the embodiment 1, boron) is added to form impurity regions 363 to 366 with a high concentration of boron. Here, by the ion doping method using diborane ($B_2H_6$), boron is added so that the concentration thereof becomes from $3 \times 10^{20}$ to $3 \times 10^{21}$ atoms/cm$^3$ (typically from $5 \times 10^{20}$ to $1 \times 10^{21}$ atoms/cm$^3$). The acceleration voltage can be 20 to 30 kV. The impurity region doped with the p-type impurity element in the above concentrations is to be referred to as the p-type impurity region (a).

Each of the p-type doped regions (a) 363 to 366 includes a region already doped with phosphorus in concentrations from $1 \times 10^{20}$ to $1 \times 10^{21}$ atoms/cm$^3$. Here, however, boron is added in at least three times or more concentrations compared to the concentrations of phosphorus. Therefore, the already formed n-type impurity regions are completely reversed to p-type to function as p-type impurity regions.

Next, the resist mask 362 is removed before forming a protection film (not shown) of a silicon nitride film or a silicon oxynitride film. Then, the n-type and p-type impurity element added in respective regions in different concentrations are added. As a means for activating in the embodiment 1, a furnace annealing method is employed, and heat treatment is carried out in an electric furnace in a nitrogen atmosphere at 550° C. for 4 hours. At this time, it is desirable to keep an oxygen concentration in the nitrogen atmosphere the lowest as much as possible. This is for preventing the gate electrodes from being oxidized, and oxygen concentration is preferably taken as 1 ppm or less.

Figure 3C:
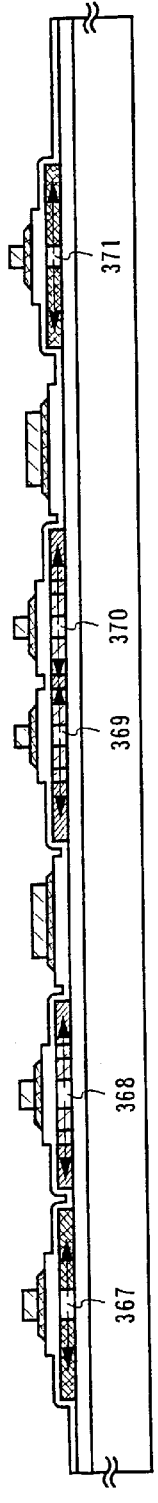

At this time, as shown in FIG. 3C, nickel atoms used for crystallizing the amorphous silicon film migrate in directions indicated by arrows toward the regions doped with the n-type impurity element, namely toward the n-type doped regions or p-type doped regions containing the n-type impurity element, gettering is performed. Namely, the nickel concentration in channel forming regions 367 to 371 of the TFT is considerably reduced to be at most $1 \times 10^{16}$ atoms/cm$^3$ or less (though the value is the measurable lower limit using the secondary ion mass spectrometry).

Further, a protecting film 372 of a silicon nitride film or a silicon oxynitride film is formed before a hydrogenation treatment is carried out with a heat treatment at temperatures from 300 to 450° C. in nitrogen atmosphere for performing hydrogen-termination of dangling bonds of the semiconductor by thermally excited hydrogen atoms. In the treatment, hydrogen included in the protecting film 372 diffuses to perform the hydrogenation treatment. Besides this, a plasma hydrogenation treatment can be carried out.

The hydrogenation treatment can be carried out also by performing a heat treatment at 300 to 450° C. for 1 to 12 hours in an atmosphere containing 3 to 100% hydrogen.

Figure 3D:
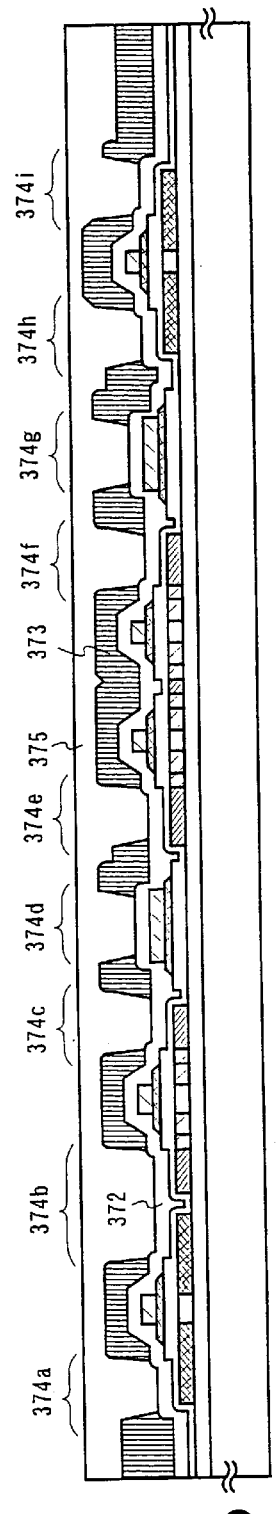

Then, as shown in FIG. 3D, a coloring layer 373 is formed to a thickness of 0.3 to 2 µm by a printing method, a spin coat method, or an ink jet method in the embodiment 1. As the coloring layer 373, a resin film containing a pigment can be used. Here, the coloring layer 373 is formed before openings 374a to 374i are formed. The openings are formed for the purpose of removing beforehand the coloring layer at portions where contact holes are to be formed later.

For the coloring layer 373, a coloring layer which allows light with a peak at a wavelength of approximately 650 nm to pass through (hereinafter referred to as a red coloring layer), allows light with a peak at a wavelength of approximately 550 nm to pass through (hereinafter referred to as a green coloring layer), or allows light with a peak at a wavelength of approximately 450 nm to pass through (hereinafter referred to as blue coloring layer) can be used. Coloring layers that allow light with other colors to pass through can be of course used.

In order to ensure much amount of light, the coloring layer with low content of pigment can be better used for the EL light emitting device. Besides by thinning the thickness of the coloring layer, more amount of light can be obtained. Further, it is unnecessary for the coloring layer to provide a transmitted light with a sharp peak at the peak wavelength as in a liquid crystal display device, but it is desirable for the coloring layer to provide a transmitted light with a broad peak around the peak wavelength.

In addition, by making the coloring layer contain a black pigment, external light entering the EL light emitting device from outside can be absorbed to avoid that an image of a watcher is projected on a cathode.

Moreover, the embodiment 1 is characterized in that the red coloring layer is used as a shielding film for reducing a leak current of the TFT. Since the crystalline silicon film to become the channel forming region has a small absorption coefficient for light with a wavelength of approximately 650 nm, it is considered that the red light does not affect an increase in the leak current with respect to the red light. Therefore, in the embodiment 1, the red coloring layer is used for shielding light with a wavelength of approximately 550 nm (green light) and light with a wavelength of approximately 450 nm (blue light) to prevent the leak current of the TFT from being increased.

In the embodiment 1, there is shown a structure in which coloring layers are provided. However, the structure can be presented without providing the coloring layers.

Furthermore, an interlayer insulating film 375 is formed, covering the coloring film 373 with the openings 374a to 374i. The interlayer insulating film 375 is desirably provided so as to sufficiently flatten steps formed by providing the coloring layer 373. Therefore, the interlayer insulating film 375 is formed with a thickness of 1 to 4 µm (preferably 2 to 3 µm).

Plasma treatment using $CF_4$ gas is effectively performed to the surface of the interlayer insulating film 375. The treatment can enhance adhesive properties of wirings toe formed in the next step.

Figure 4A:
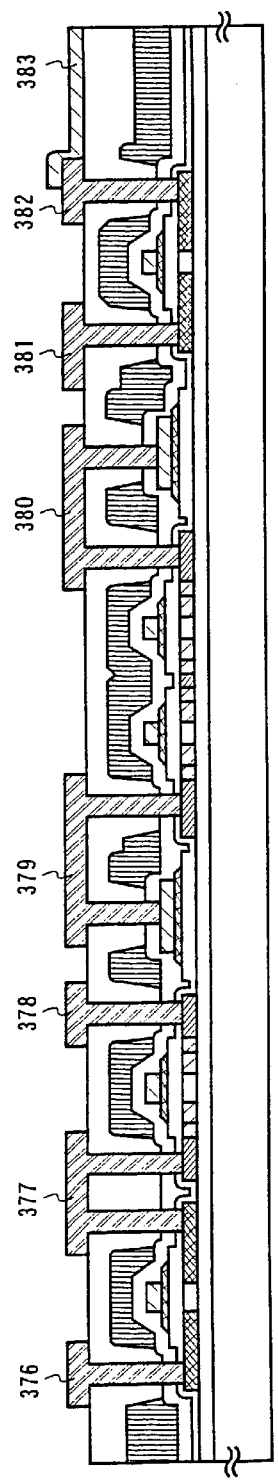
FIG. 4A and FIG. 4B are cross sectional views showing the steps of manufacturing the pixel section and the driving circuit of the EL light emitting device according to Embodiment 1 subsequent to the step shown in FIG. 3D and until the EL light emitting device is completed.

Subsequently, as shown in FIG. 4A, contact holes are formed in the interlayer insulation film 375 for forming wirings 376 to 382. In the embodiment 1, the wirings is provided as a lamination film of three layer structure. A 50 nm thick of titanium film, 400 nm thick of aluminum film containing titanium and a 100 nm thick of titanium film are continuously formed in turn by a sputtering method. Of course, other kinds of conductive films can be used.

The wirings 376 and 378 function as source wirings for a CMOS circuit, the wiring 377 as a drain wiring. Further, the wiring 379 functions to electrically connect the source wiring 340 and the source region of the switching TFT and the wiring 380 functions to electrically connect the source wiring a 341 and the drain region of the switching TFT.

Next, a pixel electrode 383 is formed of an oxide conductive film which is transparent to visible light. In the embodiment 1, an oxide conductive film for which gallium oxide is added to zinc oxide, is used as the pixel electrode 383 with a thickness of 120 nm. Besides this, an oxide conductive film of indium oxide, zinc oxide, tin oxide, or a compound of combination of them can be used.

Figure 4B:
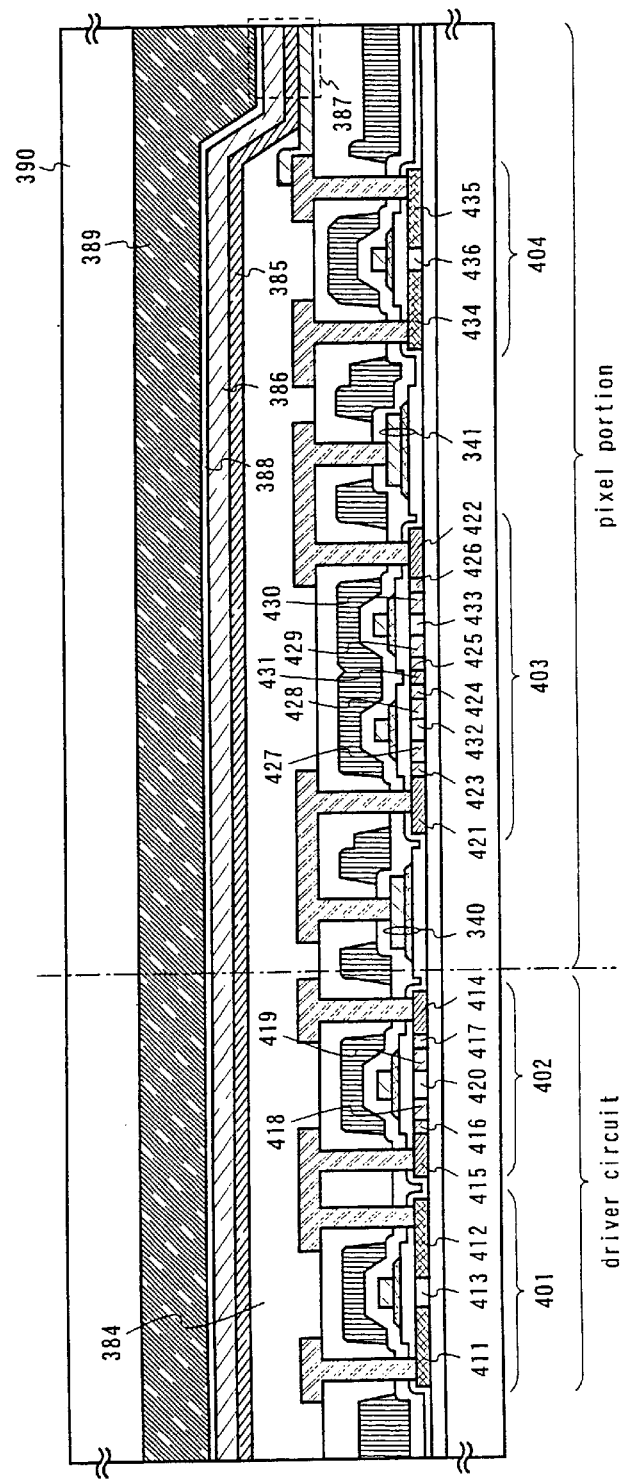

Following this, as shown in FIG. 4B, a bank 384 is formed. The bank 384 can be formed by patterning a 10 to 400 nm thick insulating film containing silicon or organic resin film. The bank 384 is formed so as to fill in between pixels (between pixel electrodes). Moreover, it is provided for the purpose of preventing an organic EL material such as a light emitting layer formed in the next step from being in directly contact with the edge of the pixel electrode 383. In other word, it can be referred to as an insulating film which has an opening on a flat face of the pixel electrode 383.

Since the bank 384 is an insulating film, the deposition must be carried out carefully not to cause electrostatic discharge. In the embodiment 1. carbon powder or pigment is added into the insulating film to be the material of the bank 384 to lower resistivity and to prevent generation of static electricity. At this time, the amount of the carbon powder or pigment to be added can be adjusted so that the resistivity becomes from $1 \times 10_6$ to $1 \times 10^{12}$ Ωm (preferably from $1 \times 10^3$ to $1 \times 10^{10}$ Ωm).

Here, preliminary treatment is carried out to the surface of the pixel electrode 383. In the embodiment 1, the whole substrate is heated at 100 to 120° C., irradiation of ultraviolet is carried out while forming oxygen plasma. This allows the surface of the pixel electrode 383 as an anode to be treated by ozone plasma. As a result of the preliminary treatment, adsorbed oxygen and adsorbed water are removed from the surface of the pixel electrode 383 to allow a work function at the surface to be increased. Furthermore, the flatness of the anode surface is improved, which is favorably made so as to have an average square roughness (Rms) of 5 nm or less (preferably 3 nm or less).

Instead of the ozone plasma treatment, a plasma treatment using a rare gas such as argon, neon, or helium can be employed.

Next, an EL layer 385 is formed by a spin coat method. In the embodiment 1, a laminate of a hole injecting layer and a light emitting layer is referred to as an EL layer. Namely, a laminate, which is a combination of a light emitting layer with a hole injecting layer, a hole transport layer, a hole stopping layer, an electron transport layer, an electron injecting layer, or an electron stopping layer, is defied as an EL layer. A material of each of the above layers can be an organic material or an inorganic material, and high-molecular or low-molecular.

In the embodiment 1, polythiophene (PEDOT) is first formed to a thickness of 20 nm as a hole injecting layer. Furthermore, as a light emitting layer that emits white light, polyvinyl carbazole (PVK) is formed to a thickness of 80 nm. The polythiophne can be applied in being dissolved in water, and the polyvinyl carbazole can be applied in being dissolved in 1,2-dichloromethane. The hole injecting layer and the light emitting layer after being applied are heat treated within a temperature range (typically from 80 to 120° C.) that causes no breakage of the EL layer, and are obtained as a thin film by making solvent volatilize.

For example, a solution can be used, in which PVK, Bu-PBD (2-(4'-tert-butylphenyl)-5-(4"-biphenyl)-1,3,4-oxadiazole), coumarin 6, DCMI (4-dicyanomethylene-2-methyl-6-p-dimethylaminostyryl-4H-pyran), TPB (tetraphenylbutadiene), and Nile red are dissolved into the 1,2-dichloromethane.

Besides, as a polymer material which can be used as the light emitting layer that emits white light, materials disclosed in JP-A-8-96959 or JP-A-9-63770 can be used.

After the EL layer 385 is formed, a cathode 386 of a conductive film with low work function is formed to a thickness of 400 nm. In the embodiment 1, aluminum and lithium are alloyed by co-vapor-deposition. In this way, an EL element 387 is formed which includes the pixel electrode 383, the EL layer 385, and the cathode 386.

After forming the cathode 386, a passivation film 88 can be effectively provided so as to completely cover the EL element 387. At this time, it is preferable to use a film with good coverage as the passivation film 388, and a silicon nitride film or carbon film (particularly the DLC film) is effectively used. The DLC film can be deposited in the temperature range from the room temperatures to 100° C. or less, and can be easily deposited on the EL layer 385 which is low heat-resistant. In addition, the high blocking effect against oxygen can prevent the EL layer 385 and the cathode 386 from being oxidized.

Furthermore, on the passivation film 388, a sealer 389 is provided on the passivation film 388, and a cover material 390 is bonded. As the sealer 389, ultraviolet-curing resin can be used, in which a material with hygroscopic effect or a material with anti-oxidizing effect is effectively provided.

As the cover material 390, a glass substrate, a metal substrate, a ceramics substrate, or a plastic substrate (including a plastic film) can be used. On each side or one side of the cover material 390, a carbon film, particularly a DLC film, can be effectively provided. In the case of using the plastic film as the cover material, the DLC film can be deposited on each side by a roll-to-roll process.

Thus, an EL light emitting device with a structure as shown in FIG. 4B is completed. Here, the steps after forming the bank 384 to forming the 386 are effectively processed continuously using deposition equipment with a multi-chamber system (or in-line system) without exposing the system to the atmosphere. However, in forming the EL layer by the spin coat method, the treatment can be carried out in an atmosphere of nitrogen with deoxidation treatment or in rare gas.

Here, each TFT will be explained. A driving circuit is configured with the CMOS circuit being made as a basic unit in which a p-channel TFT 401 and an n-channel TFT 402 are complimentarily combined. Here, the circuit referred to as the driving circuit includes a shift register, a buffer, a level shifter, a latch a sampling circuit (including a transfer gate), or a D/A converter etc.

The active layer of the p-channel TFT 401 includes a source region 411, a drain region 412, and a channel forming region 413. Each of the source region 411 and the drain region 412 is provided so as to overlap the first gate electrode 335a with the gate insulating film 308 therebetween.

Moreover, the active layer of the n-channel TFT 402 includes a source region 414, a drain region 415, n-type impurity regions (b) 416 and 417, n-type impurity regions (c) 418 and 419, and a channel forming region 420. Each of the n-type impurity regions (b) 416 and 417 is provided so as not to overlap the first gate electrode 336a with the gate insulating film 308 therebetween. Each of the n-type impurity regions (c) 418 and 419 is provided so as to overlap the first gate electrode 336a with the gate insulating film 308 therebetween. Each of the n-type impurity regions (c) 418 and 419 provided so as to overlap the first gate electrode 336a has an effect of suppressing hot carrier injection to make it possible to effectively prevent deterioration phenomenon due to the hot carrier injection.

Furthermore, in the pixel section, there are formed a switching TFT 403 and a current controlling TFT 404. The drain of the switching TFT 403 is electrically connected to the gate of the current controlling TFT 404, and a switching operation of the current controlling TFT 404 is controlled through the switching TFT 403. Further, the current controlling TFT 404 controls an amount of current flowing the EL element.

The active layer of the switching TFT 403 includes a source region 421, a drain region 422, n-type impurity regions (b) 423 to 426, n-type impurity regions (c) 427 to 430, an isolation region 431, and channel forming regions 432 and 433. Moreover, the source region 421 is connected to the source wiring 340 through the wiring 379. Furthermore, the drain region 422 is connected to the drain wiring 341 through the wiring 380. The drain wiring 341 is connected to the gate electrode 339 of the current controlling TFT 404.

The structure of the switching TFT 403 is basically the same as that of the n-channel TFT 402. Each of the n-type impurity regions (b) 423 and 424 is provided so as not to overlap the first gate electrode 337a with the gate insulating film 308 therebetween, and each of the n-type impurity regions (b) 425 and 426 is provided so as not to overlap the first gate electrode 338a with the gate insulating film 308 therebetween. Each of the n-type impurity regions (c) 427 and 428 is provided so as to overlap the first gate electrode 337a with the gate insulating film 308 therebetween, and each of the n-type impurity regions (c) 429 and 430 is provided so as to overlap the first gate electrode 338a with the gate insulating film 308 therebetween That is, the structure is provided so as to have a strong resistance to the hot carrier deterioration.

In the embodiment 1, an n-channel TFT is used as the switching TFT 403. However, a p-channel TFT can also be used.

Moreover, the active layer of the current controlling TFT 404 includes a source region 434, a drain region 435, and a channel forming region 436. The structure of the current controlling TFT 434 is basically the same as that of the p-channel TFT 401. Each of the source region 434 and the drain region 435 is provided so as to overlap the first gate electrode 339a with the gate insulating film 308 therebetween. In the embodiment 1, a p-channel TFT is used as the current controlling TFT 404. However, an n-channel TFT can also be used.

Figure 5:
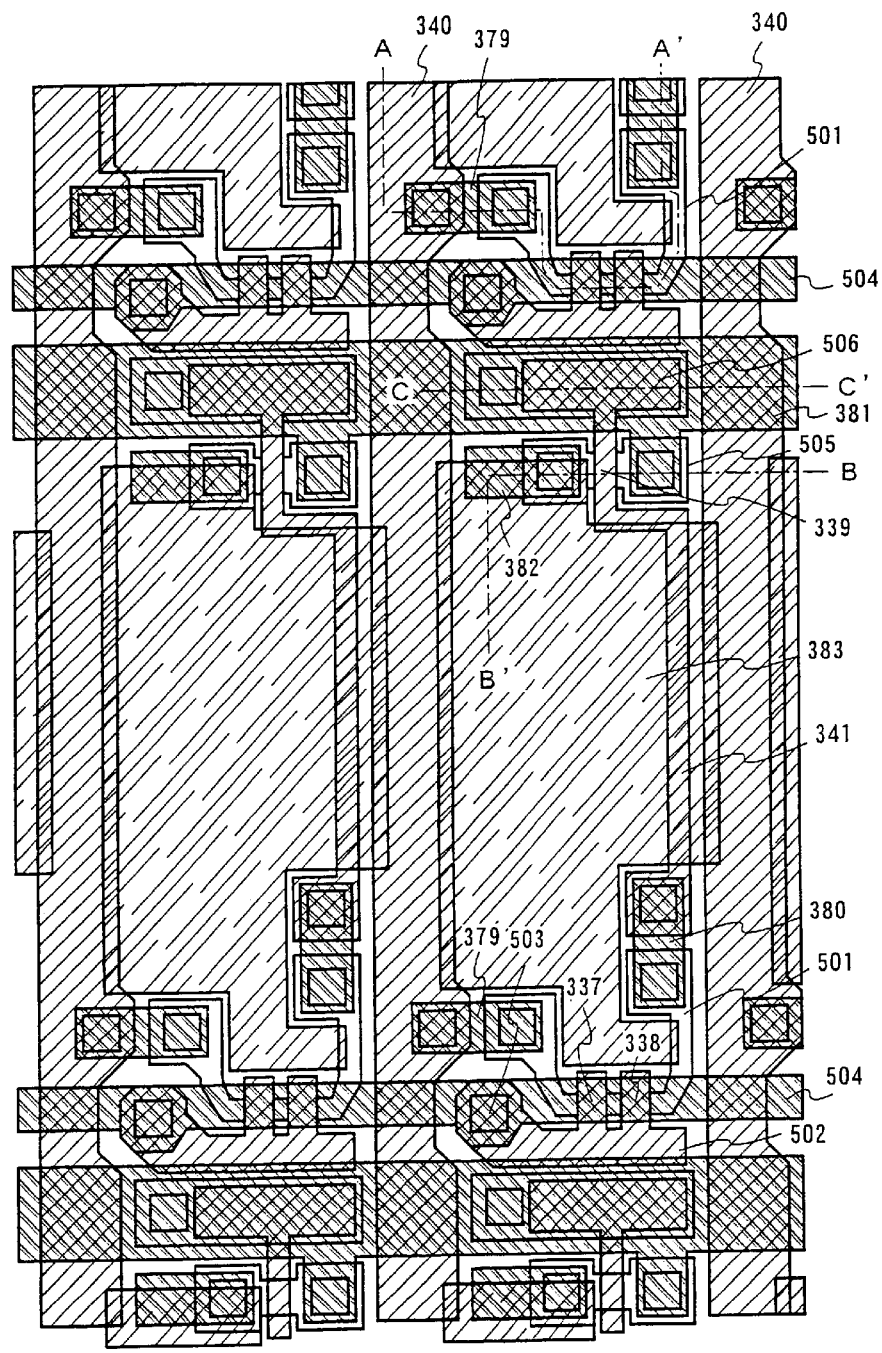
FIG. 5 is a plan view showing an upper structure of the pixel section of the EL light emitting device according to Embodiment 1.
Figures 6A, 6B, 6C:
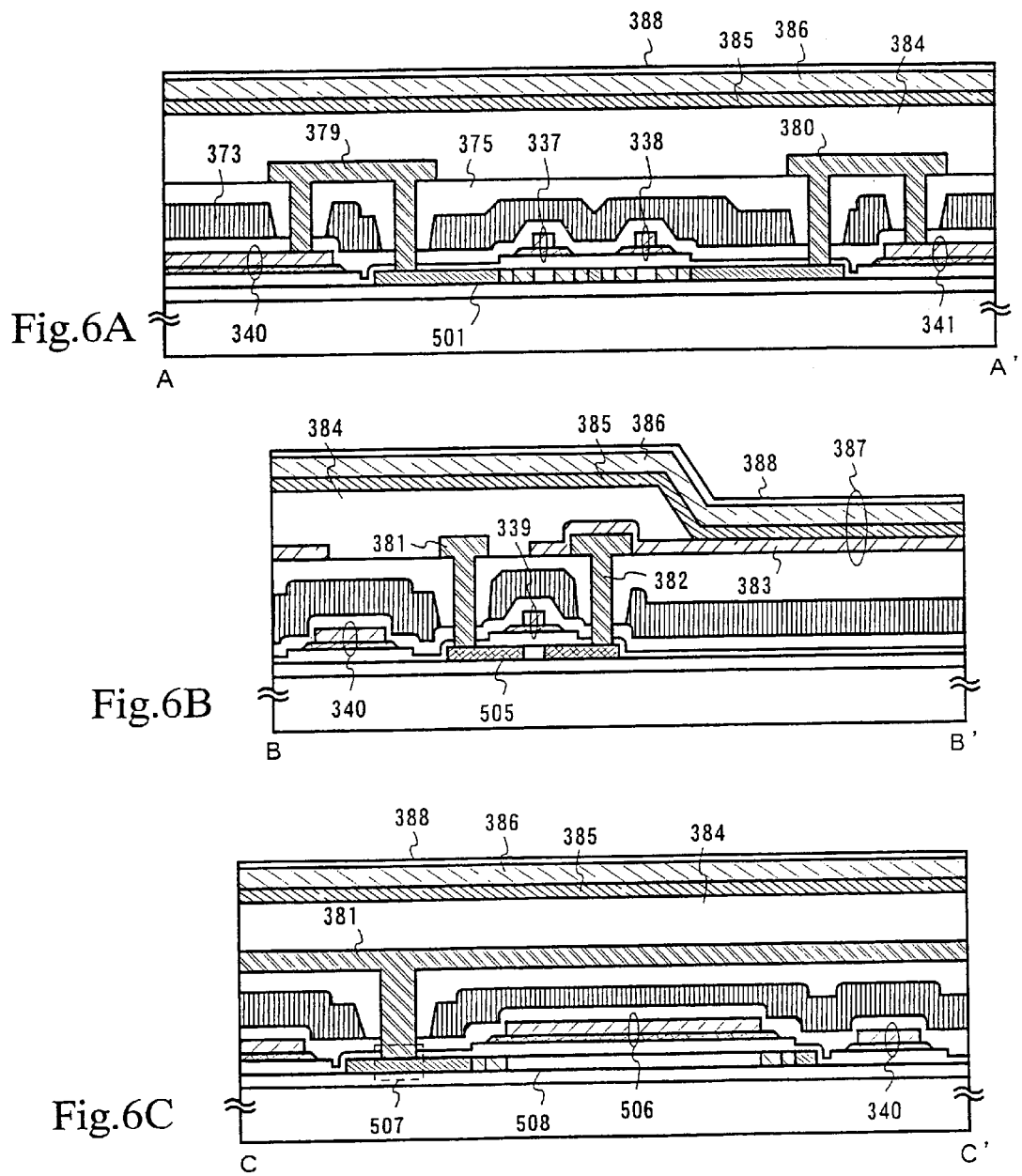
FIG. 6A is a view of a cross section cut along line A–A' in FIG. 5 showing a structure of a switching TFT in the pixel section.
FIG. 6B is a view of a cross section cut along line B–B' in FIG. 5 showing a structure of a current controlling TFT in the pixel section.
FIG. 6C is a view of a cross section cut along line C–C' in FIG. 5 showing a structure of a holding capacitor in the pixel section.

Here, a view of the pixel portion seen from above is shown in FIG. 5. In addition, a view of a cross section taken along line A–A' in FIG. 5 is shown in FIG. 6A. a view of a cross section taken along line B–B' is shown in FIG. 6B, and a view of a cross section taken along line C–C' is shown in FIG. 6C. FIGS. 6A. 6B and 6C show structures of the cross sections of the switching TFT 403, the current controlling TFT 404, and a holding capacitor, respectively. The pixel portion shown in FIG. 5 and FIG. 6A to FIG. 6C can be formed in accordance with the manufacturing steps shown in FIG. 2A through FIG. 4B, and explanation will be made with reference to reference numerals and characters used in FIG. 2A through FIG. 4B as necessary.

First, the switching TFT 403 will be explained using FIG. 5 and FIG. 6A. In FIG. 5 and FIG. 6A, reference numeral 501 denotes an active layer. Details of the active layer 501 are explained with reference to FIG. 4B and the explanation is omitted here. The source wiring 340 is electrically connected to the active layer 501 through the wiring 379, and further electrically connected to the drain wiring 341 through the wiring 380.

In FIG. 5, a gate electrode 502 is provided over the active layer 501. In the gate electrode 502, portions which overlap the active layer 501 correspond to the gate electrodes 337 and 338 shown in FIG. 2E. The gate electrode 502 is electrically connected to a gate wiring 504 at a contact portion 503.

Next, the current controlling TFT 404 will be explained using FIG. 5 and FIG. 6B. In FIG. 5 and FIG. 6B, reference numeral 505 denotes an active layer. Details of the active layer 505 are explained with reference to FIG. 4B and the explanation is omitted here. The source region in the active layer 505 is electrically connected to the wiring (current supply line) 381, and the drain region is electrically connected to the wiring 382 and the pixel electrode (anode of the EL element) 383.

The gate electrode 339 is provided over the active layer 505. The gate electrode 339 corresponds to a portion where the drain wiring 341 overlaps the active layer 505. The drain wiring 341 is extended to be an upper electrode 506 of the holding capacitor shown in FIG. 6C. The wiring (current supply line) 381 is electrically connected to a semiconductor film 508 at a contact portion 507. The semiconductor film 508 functions as a lower electrode of the holding capacitor.

Figure 7:
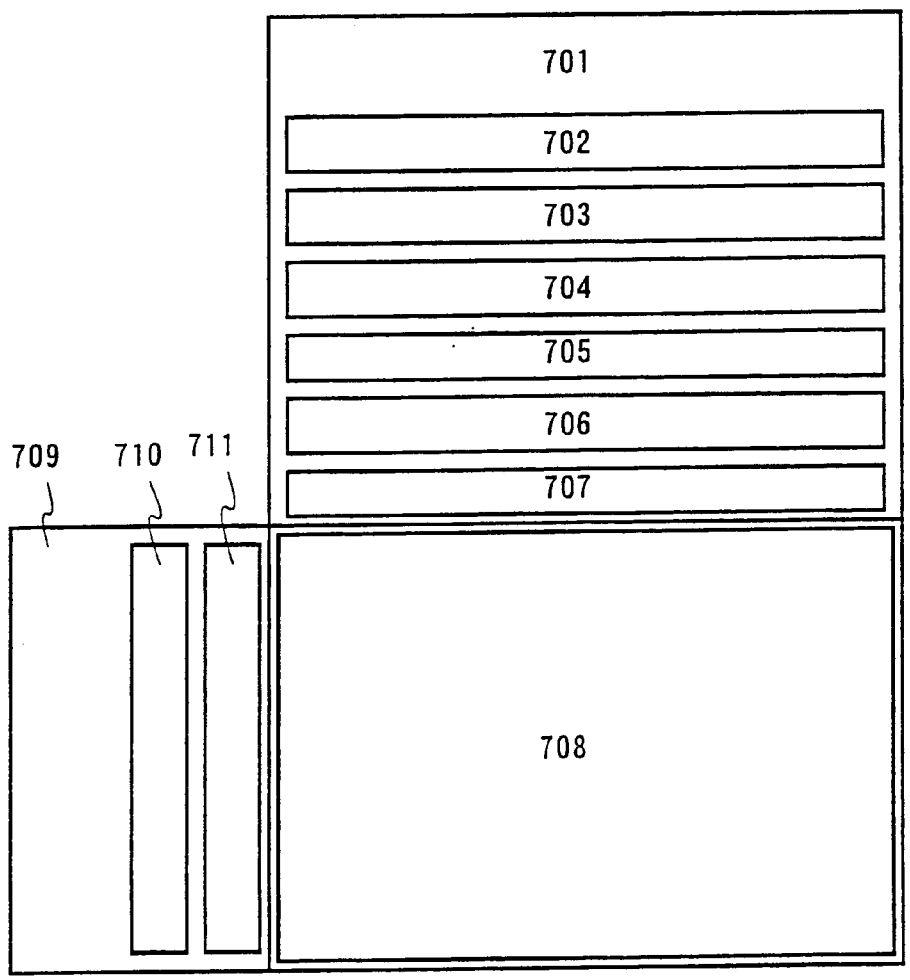
FIG. 7 is a schematic diagram showing an example of a circuit configuration of the EL light emitting device according to Embodiment 1.

An example of a circuit configuration of the EL light emitting device of the embodiment 1 is shown in FIG. 7. In the embodiment 1, there is presented a circuit configuration for carrying out digital driving, which has a source side driving circuit 701, a pixel portion 708, and a gate side driving circuit 709. A driving circuit portion is a general name including the source side driving circuit and the gate side circuit In the embodiment 1, there is provided the n-channel TFT with the structure as shown in FIG. 4B as a switching TFT. in the pixel portion The switching TFT is arranged at an intersection of a gate wiring connected to the gate side driving circuit 709, and a source wiring connected to the source side driving circuit 701. The drain of the switching TFT is electrically connected to a gate of the p-channel current controlling TFT.

The source side driving circuit 701 is provided with a shift register 702, a buffer 703, a latch (A) 704, a buffer 705, a latch (B) 706, and a buffer 707. In an analog driving, a sampling circuit (a transfer gate) can be provided instead of the latches (A) and (B). The gate side driving circuit 709 is provided with a shift register 710 and a buffer 711.

Though not shown, a gate side driving circuit can be further provided on the other side of the pixel section 708 and opposite the gate side driving circuit 709 with the pixel section 708 put between them. In this case, the two gate side driving circuits have the same structure sharing the gate wiring, and even when one of them is broken, the pixel portion is normally operated by a signal transmitted from the other one left unbroken.

The above configuration can be easily realized by manufacturing the TFT in accordance with the manufacturing steps shown in FIG. 2A through FIG. 4B. Although only constitutions of the pixel portion and the driving circuit portion are shown in the embodiment 1, logic circuits such as a signal separation circuit. a D/A converter, an operational amplifier, and a gamma compensation circuit can be formed on the same substrate in accordance with the manufacturing method of the present inpention. Furthermore, it is considered that memories and a micro processor and the like can be also formed.

The EL light emitting device according to the embodiment 1 after the step of sealing (or encapsulating) for protecting the EL element will be further explained using FIGS. 8A and 8B. Here, reference numerals used in FIG. 7 will be referred to as necessary.

FIG. 8A is a top view showing the EL device in a state after the sealing. Sections shown by broken lines and denoted by reference numerals 701, 708, and 709 are the source side driving circuit, the pixel portion, and the gate side driving circuit, respectively. Furthermore, reference numerals 1001, 1002, and 1003 denote a cover material, a first sealer, and a second sealer, respectively. There is provided an sealing medium (not shown) between inside of the cover material 1001 enclosed by the first sealer 1002 and the substrate on which the EL element is formed.

Reference numeral 1004 denotes wirings for transmitting signals inputted to the source side driving circuit 701 and the gate side driving circuit 709. Each of the wirings 1004 receives a video signal or a clock signal from an FPC 1005 which is an external input terminal.

Here, a cross section is shown in FIG. 8B, which is corresponding to a section of the EL device shown in FIG. 8A cut along line A–A'. In FIGS. 8A and 8B, the same reference numerals are used for denoting the same constituents.

As shown in FIG. 8B, there are formed the pixel portion 708 and the gate side driving circuit 709 on a glass substrate 1006. The pixel portion 708 is formed with a plurality of pixels each including the current controlling TFT 404 and the pixel electrode 383 connected to the drain of the current controlling TFT 404. The gate side driving circuit 709 is formed using a CMOS circuit in which the p-channel TFT 401 and the n-channel TFT 402 is complimentarily combined.

The pixel electrode 383 functions as an anode of the EL element. At each end of the pixel electrode 383, there is formed a bank 384, and there are formed the EL layer 385 and the cathode 386 of the EL element on the pixel electrode 383. The cathode 386 also functions as a common wiring to all of the pixels and is electrically connected to the FPC 1005 via the wiring 1004. Further, all of the elements included in the pixel portion 708 and the gate side driving circuit 709 are covered by the cathode 386.

Moreover, the cover material is bonded by the sealer 1002. In this case, a spacer can be provided for keeping a interval between the cover material 1001 and the EL element. The inside of the first sealer 1002 is filled with a sealing medium 1007. A photo-setting resin is preferably used for the first sealer 1002 and the sealing medium 1007. In addition, it is desirable that the first sealer 1002 is a material that allows no water and no oxygen pass through. Further, the sealing medium 1007 can be made to contain a material with moisture-absorption effect or a material having anti-oxidizing effect.

The sealing medium 1007 provided to cover the EL element also functions as an adhesive for bonding the cover material 1001. As the sealing medium 1007, polyimide, acrylic resin, PVC (Polyvinyl Chloride), epoxy resin, silicone resin, PVB (Polyvinyl Butyral) or EVA (Ethylene-Vinyl Acetate) can be used.

In the embodiment 1, as the cover material 1001, a glass plate, a quartz plate, a plastic plate, a ceramic plate, an FRP (Fiberglass-Reinforced Plastics) plate, a PVF (Polyvinyl Fluoride) film, a Mylar film (a trade name of a polyethylene glycol terephthalate film manufactured by Du Pont), a polyester film or an acrylic film can be used.

Furthermore, in the embodiment 1, on both faces of the cover material 1001, carbon films (specifically, DLC films) 1008a and 1008b are provided in thicknesses from 2 to 30 nm. Such carbon films play roles of preventing oxygen and water from entering and of mechanically protecting the surfaces of the cover material 1001. Of course, it is also possible to bond a polarizing plate (typically a circular polarizing plate) onto the carbon film 1008a of the outside.

Moreover, after the cover material 1001 is adhesively bonded using the sealing medium 1007, the second sealer 1003 is provided so as to cover the side face (exposed face) of the sealing medium 1007. The same material as is used for the first sealer 1002 can be used as the second sealer 1003.

By sealing the EL element in the sealing medium 1007 with the structure as described above, the EL element can be completely isolated from outside and it becomes possible to prevent materials such as water and oxygen, which enhance deterioration of the EL layer due to oxidation, from entering from outside. Therefore, the EL light emitting device can be manufactured as high reliability.

EMBODIMENT 2

Figure 10:
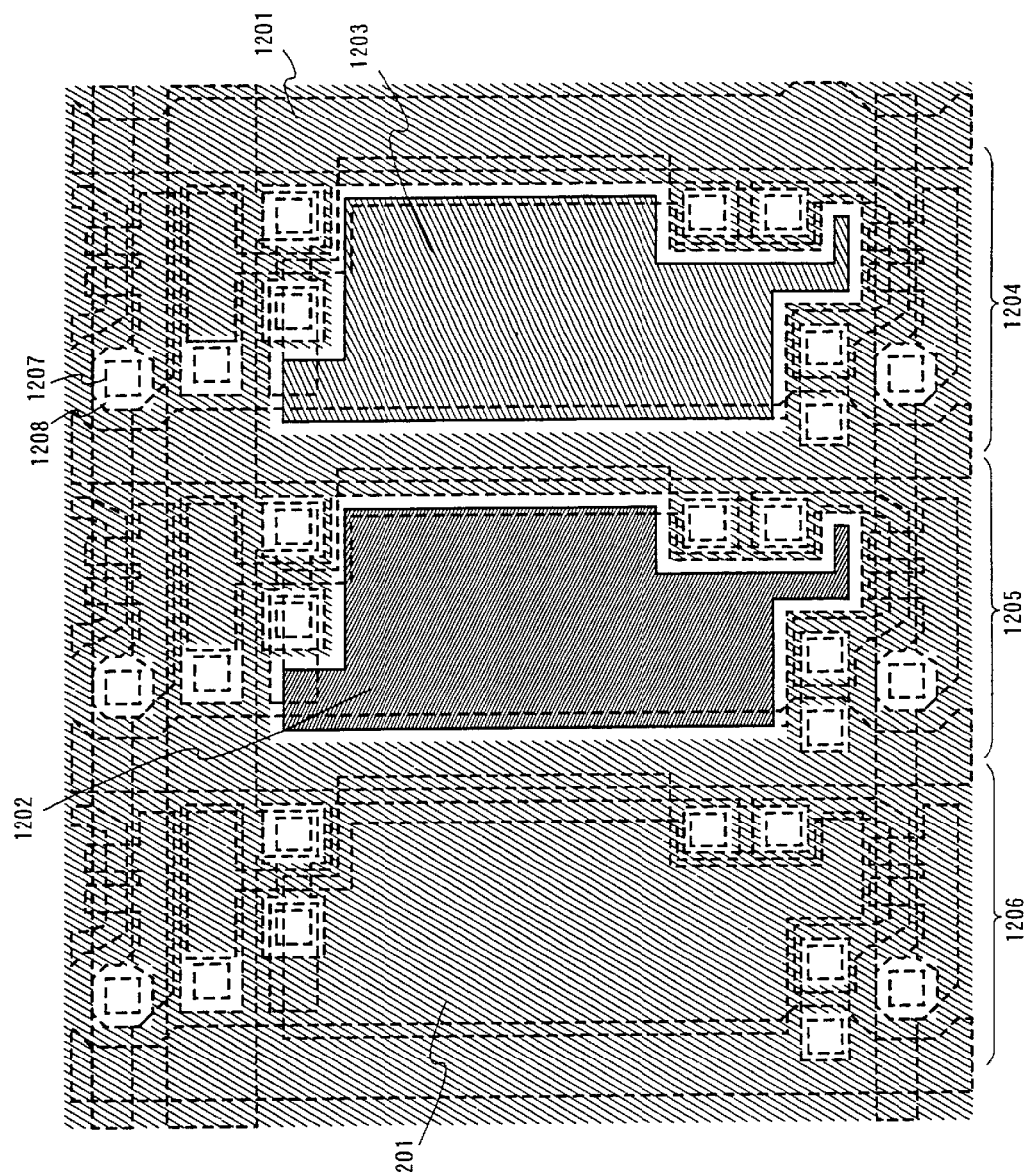
FIG. 10 is a plan view showing an upper structure of the pixel section of the EL light emitting device according to Embodiment 2.

In the embodiment 2, an example of arranging the coloring layer is explained using FIG. 10. What is shown in FIG. 10 is a view of the pixel portion seen from above. The structure of each of the pixels is same as that explained using FIG. 5 and FIG. 6A to FIG. 6C.

In FIG. 10, reference numerals 1201, 1202, and 1203 denote a red coloring layer, a green coloring layer, and a blue coloring layer, respectively. Moreover, reference numerals 1204, 1205, and 1206 are pixels for emitting blue color, green color, and red color, respectively. Here, in the embodiment 2, the pixel 1204 for blue color is provided with the blue coloring layer 1203, the pixel 1205 for green color is provided with the green coloring layer 1202, and the red coloring layer 1201 is provided above the pixel 1206 for red color and each TFT. The red coloring layer 1201 has an opening portion 1208 at each contact portion 1207.

The crystalline silicon film made to be the active layer of the TFT has a characteristic that an absorption coefficient to the light (red light) with a peak at a wavelength of approximately 650 nm is small. Therefore, it is considered effective in reducing the leak current (or off-current) due to optical excitation of the crystalline silicon film that the crystalline silicon film is made free from being exposed to blue light and green light with peaks at wavelengths of approximately 450 nm and 550 nm, respectively.

Thus, in the embodiment 2, there is provided a structure in which the red coloring layer to absorb green light and blue light is provided above the TFT so that the light with wavelengths approximately 400 to 550 nm is shielded. This makes it possible to avoid an increase in the leak current of the TFT due to the light emitted from the EL element.

It is also effective to make each of the coloring layers contain a black pigment or carbon particles. This makes external light entering from outside absorbed to avoid that an image of a watcher is projected on the cathode to produce. However, since excessive content of the above additives will reduce amount of the emitted light, then it is desirable that the amount of the additives is made as 1 to 10%.

The embodiment 2 can be embodied in being combined with the embodiment 1.

EMBODIMENT 3

In the embodiment 1, an example is presented, in which an EL material, from which emission of white light can be obtained, is used as the light emitting layer. The white light emitted is then made to pass through the red coloring layer, the green coloring layer, and the blue coloring layer to obtain red light, green light, and blue light, respectively.

In the embodiment 3, unlike the embodiment 1. Light emitting layers, from which red light, green light, and blue light can be obtain, are formed in pixels for red, green, and blue, respectively. The red light, the green light, and the blue light emitted from the respective light emitting layers are made to pass through the red coloring layer, the green coloring layer, and the blue coloring layer, respectively, to improve purity of each color.

In the embodiment 3, it is necessary to deposit three kinds of EL materials which respectively emit red, green and blue. However, known materials can be used. In addition, it is also necessary to carry out the deposition separately for each kind of the pixel, and it can be carried out to deposit a low-molecular group EL material by a vapor deposition method using shadow masks, or to deposit a high-molecular group EL material by an ink jet method or printing method.

The constitution according to the embodiment 3 can be embodied with freely combining with the embodiment 1 or the embodiment 2. Moreover, as shown in the embodiment 2, it is effective to make each of the coloring layers contain a black pigment or carbon particles.

EMBODIMENT 4

In the embodiment 4, an example is presented, in which an EL material, from which emission of blue light or bluish green light can be obtained, is used as the light emitting layer. The emitted light is then made pass through a color conversion layer for obtaining red light, green light, or blue light.

In the embodiment 4, there are formed a conversion layer for converting blue light to red light in a pixel to emit red light, and a conversion layer for converting blue light to green light in a pixel to emit green light. Known color conversion layers can be used as the color conversion layer. The blue light emitted from the light emitting layer excites the color conversion layer to emit red light or green light.

Furthermore, the red light and the green light emitted from the respective color conversion layers, and the blue color emitted from the light emitting layer are made to pass through the red coloring layer, the green coloring layer, and the blue coloring layer, respectively, to improve purity of each color.

In the embodiment 4, it is necessary only to deposit the light emitting layer from which emission of blue or bluish green light is obtained. Therefore, it is preferable to deposit the light emitting layer by a simple technique such as a spin coat method or a printing method. Of course, the light emitting layer can be deposited by the vapor deposition method.

The constitution according to the embodiment 4 can be embodied with freely combining with the embodiment 1 or the embodiment 2. Moreover, as shown in the embodiment 2, it is effective to make each of the coloring layers contain a black pigment or carbon particles.

EMBODIMENT 5

In the embodiment 5, an EL light emitting device is presented, which. has a pixel portion with a different structure from that in the embodiment 1. However, except for the difference in layers on which various kinds wirings (such as a gate connection, a source wiring, a drain wiring, and current supply line) are formed, a TFT and an EL element has approximately the same structures as those presented in the embodiment 1. Therefore, with respect to the same parts as those in the embodiment 1, the reference numerals are to be referred to, which are used in FIG. 5, and FIG. 6A to FIG. 6C.

Figure 11:
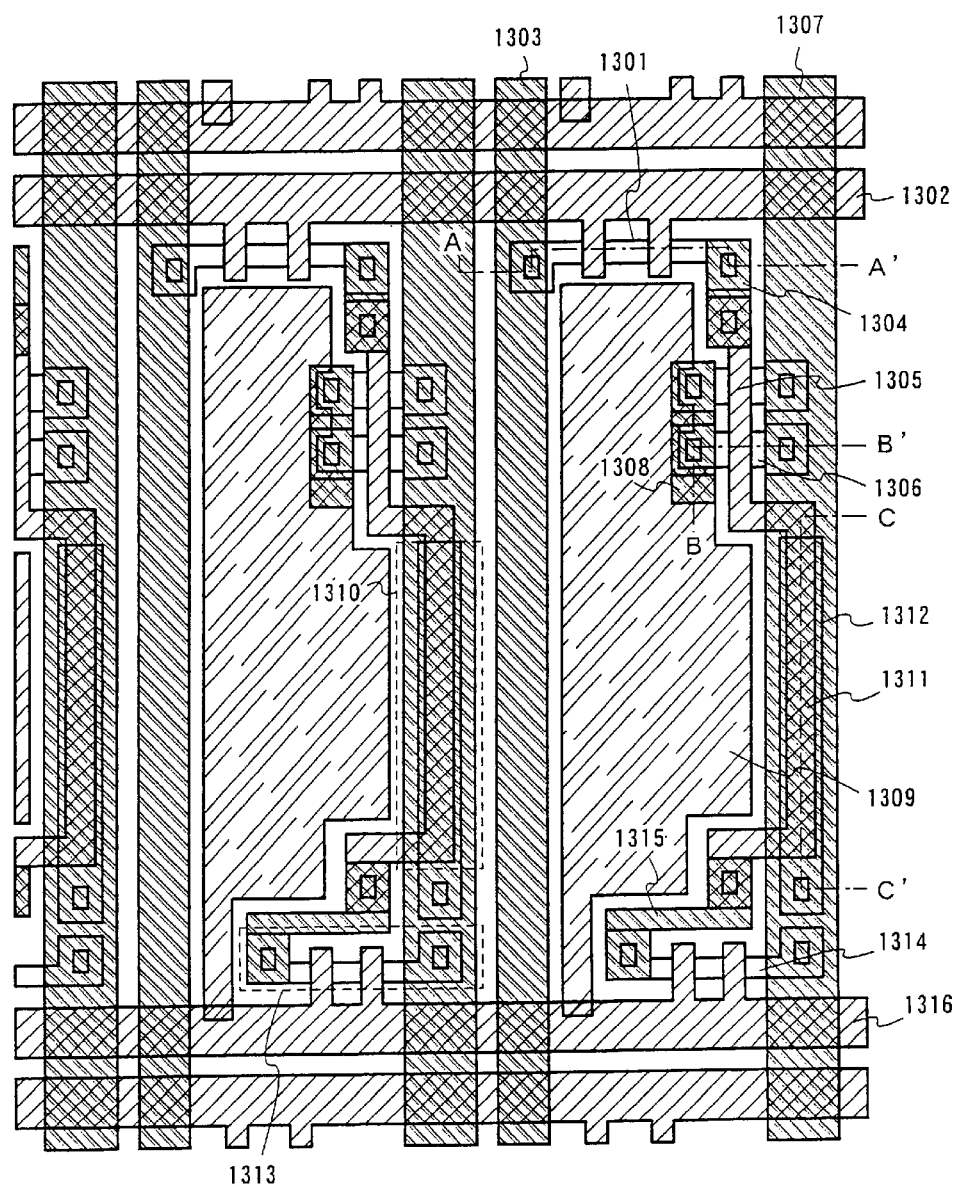
FIG. 11 is a plan view showing an upper structure of the pixel section of the EL light emitting device according to Embodiment 5.

Here, a view of a pixel portion seen from above is shown in FIG. 11. In addition, a view of a cross section takeng line A–A' in FIG. 11 is shown in FIG. 12A, a cross section taken line B—B' is shown in FIG. 12B, and a cross section taken along line C–C' is shown in FIG. 12C. FIGS. 12A, 12B, and 12C show cross section structures to a switching TFT, current controlling TFT, and a holding capacitor, respectively. The pixel portion shown here can be formed with reference to the manufacturing steps shown in FIG. 2A through FIG. 4B.

First, the switching TFT will be explained with reference to FIG. 11 and FIG. 12A. In FIG. 11 and FIG. 12A, reference numeral 1301 denotes an active layer. Details of the active layer 1301 are same as those of the switching TFT explained with reference to FIG. 4B and the explanation thereof will be omitted here. In FIG. 11, a gate wiring 1302 overlaps the active layer 1301 to function as a gate electrode. A source wiring 1303 and a drain wiring 1304 are connected to the active layer 1301. The drain wiring 1304 is connected to a gate wiring 1305 of the current controlling TFT.

In the next, the current controlling TFT will be explained with reference to FIG. 11 and FIG. 12B. Although the current controlling TFT has a structure in which two TFTs are connected in parallel, one of them will be explained here. In FIG. 11 and FIG. 12B, reference numeral 1306 denotes an active layer. Details of the active layer 1306 are same as those of the switching TFT explained with reference to FIG. 4B and the explanation thereof will be omitted here. A source region of the active layer 1306 is connected to a current supply line 1307, and a drain region is electrically connected to a pixel electrode (an anode of the EL element) 1309.

In addition, the gate wiring 1305 also functions s an upper electrode 1311 of the holding capacitor 1310 shown in FIG. 12C directly below the current supplying line 1307. Here, the current supplying line 1307 is electrically connected to a semiconductor film 1312 which functions as a lower electrode of the holding capacitor 1310. The structure in the embodiment 5 allows the holding capacitor 1310 to be completely concealed under the current supply line 1307, and, therefore, dose not allow an effective light emitting area of the pixel to be narrowed.

Subsequently, an erasing TFT will be explained. The pixel in the embodiment 5 is provided with the erasing TFT with the same structure as that of the switching TFT. In an active layer 1314 of the erasing TFT 1313, a source region is connected to the current supply line 1307, and a drain region is electrically connected to the gate wiring 1305 through the drain wiring 1315. The structure of the active layer 1314 is same as that of the switching TFT and the explanation thereof will be omitted here.

Moreover, a gate wiring of the erasing TFT (hereinafter referred to as erasing gate wiring) 1316 is provided in parallel to the gate wiring 1302 of the switching TFT.

When a signal that makes the erasing TFT 1313 in an on state enters the erasing gate wiring 1316, the potential of the gate wiring 1305 of the current controlling TFT is forced to become in same as that of the current supply line 1307. That is, the current controlling TFT becomes in an off state to supply no current to the EL element 387, and the light emission is stopped to turn the pixel off.

In this way, with providing the erasing TFT 1313, the pixel can be forced to be turned off to enhance controllability of lighting period of the pixel. Namely, in an image display by a time gray scale method, it becomes possible to easily increase the number of the gray scale. With respect to an EL light emitting device using such an erasing TFT. JP-A-11-338786 can be referred to.

The constitution according to the embodiment 5 can be embodied with freely combining with any one of the embodiments 2 through 4.

EMBODIMENT 6

In the embodiment 6, explanation will be made using FIG. 13A to FIG. 13D about an example of manufacturing an EL light emitting device by different manufacturing steps from those of the embodiment 1. Since the embodiment 6 differs from the embodiment 1 only in the intermediate manufacturing steps, the reference numerals used in the embodiment 1 will be referred to as necessary.

First, in accordance with the manufacturing steps in the embodiment 1, the EL light emitting device is manufactured up to FIG. 2E. In the embodiment 6, however, the step of adding an n-type impurity element, shown in FIG. 2C, is omitted. Thus, the state shown in FIG. 13 is obtained.

Figure 13A:
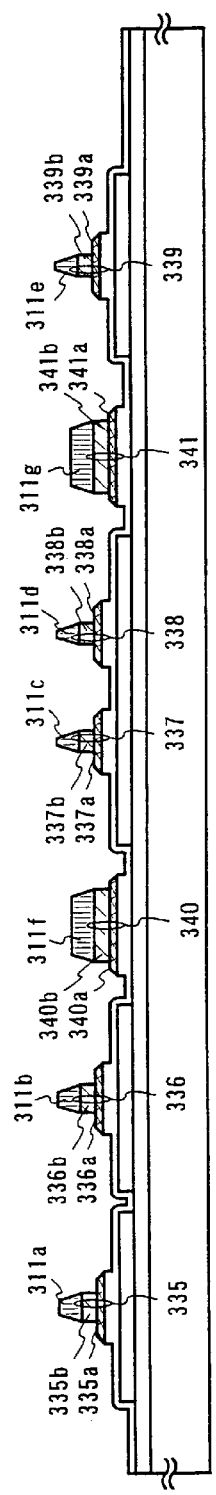
FIG. 13A to FIG. 13D are cross sectional views showing the steps of manufacturing the pixel section and the driving circuit of the EL light emitting device according to Embodiment 6 of the present invention subsequent to the steps equivalent to those shown in FIG. 2A to FIG. 2E and until the state equivalent to that shown in FIG. 3B in the embodiment 1.
Figure 13B:
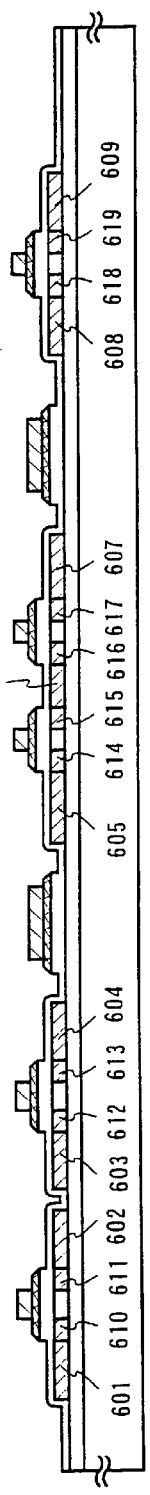

Next, as shown in FIG. 13B, after the resist masks 311a to 311e are removed, the semiconductor film is doped with an n-type impurity element (in the embodiment 6, phosphorus). The step of doping the semiconductor film with the n-type impurity element can be carried out under the same condition as that of the doping step shown in FIG. 3A in the embodiment 1.

In this way, there are formed n-type impurity regions (b) 601 to 609 and n-type impurity regions (c) 610 to 619. Concentrations of the n-type impurity element contained in the n-type impurity regions (b) 601 to 609 and the n-type impurity regions (c) 610 to 619 are same as those in the embodiment 1.

Figure 13C:
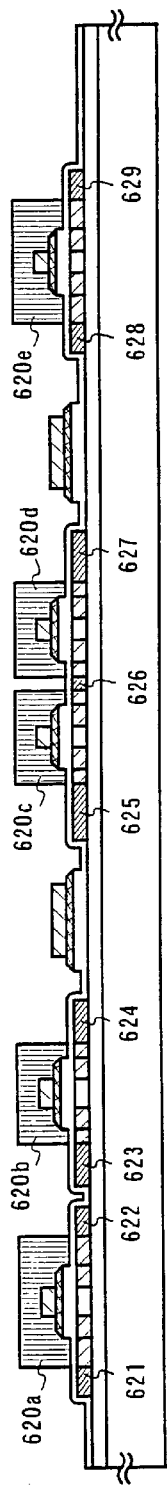

Subsequently, resist masks 620a to 620e are formed and an n-type impurity element (in the embodiment 6, phosphorus) is added like the doping step shown in FIG. 2C in the embodiment 1. In this way, there are formed n-type impurity regions (a) 621 to 629. Concentrations of the n-type impurity element contained in the n-type doped regions (a) 621 to 629 are same as those in the embodiment 1 (FIG. 13C).

In each of the n-type impurity regions (b) 601 to 609, a portion covered with corresponding one of the resist masks 620a to 620e functions as an LDD (light-doped drain) region later. The length of each n-type impurity region (b) (LDD length) that will function later as the LDD region can be freely adjusted by adjusting the length of corresponding one of the resist masks 620a to 620e. Therefore, the embodiment 6 is characterized in excellence in controllability of the LDD length.

Figure 13D:
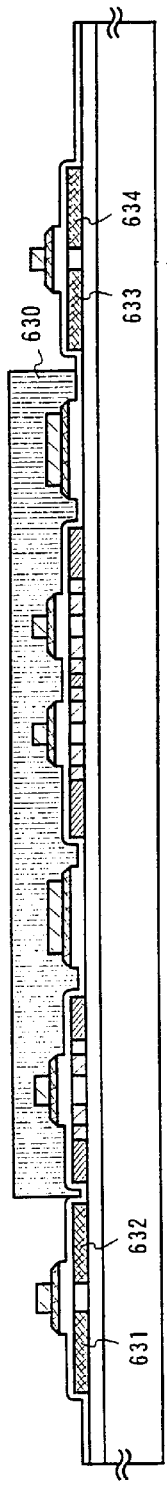

Next, the resist masks 620a to 620e are removed and a resist mask 630 is newly formed. Then, a p-type impurity element (in the embodiment 6. boron) is added for doping the semiconductor film like the doping step in the embodiment 1 as shown in FIG. 3B. Thus, there are formed p-type doped regions (a) 631 to 634. Concentrations of the p-type impurity element contained in the p-type impurity regions (a) 631 to 634 are same as those in the embodiment 1 (FIG. 13D).

Thereafter, the EL light emitting device can be manufactured in accordance with the subsequent activation step shown in FIG. 3C and the following steps of embodiment 1. Moreover, the structure of the completed TFT is approximately same as that of the embodiment 1, and the explanation of the embodiment 1 can be referred to. The constitution according to the embodiment 6 can be embodied with freely combining with any one of the embodiments 1 through 5.

EMBODIMENT 7

In the embodiment 7, explanation will be made using FIG. 14A to FIG. 14D about an example of manufacturing an EL light emitting device by different manufacturing steps from those the embodiment 1. Since the embodiment 7 only differs from the embodiment 1 only in intermediate manufacturing steps, the reference numerals used in the embodiment 1 will be referred to as necessary.

Figure 14A:
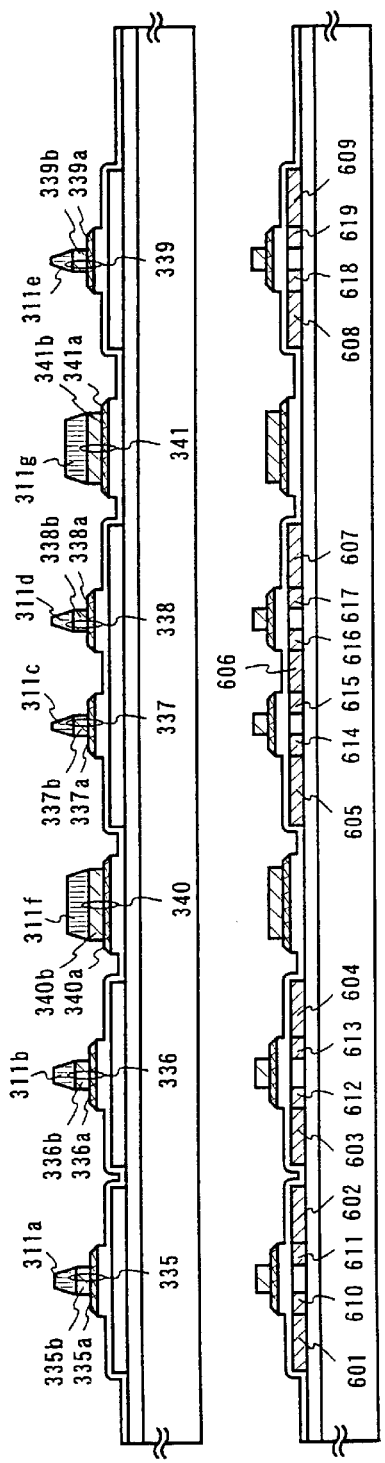
FIG. 14A to FIG. 14D are cross sectional views showing the steps of manufacturing the pixel section and the driving circuit of the EL light emitting device according to Embodiment 7 of the present invention subsequent to the steps equivalent to those shown in FIG. 2A to FIG. 2E and until the state equivalent to that shown in FIG. 3B in the embodiment 1.

First, in accordance with the manufacturing steps in the embodiment 1, the EL light emitting device is manufactured up to FIG. 2E. In the embodiment 7, however, the step of doping the active layer with an n-type impurity element, shown in FIG. 2C, is omitted. Thus, the state shown in FIG. 14A is obtained.

Figure 14B:
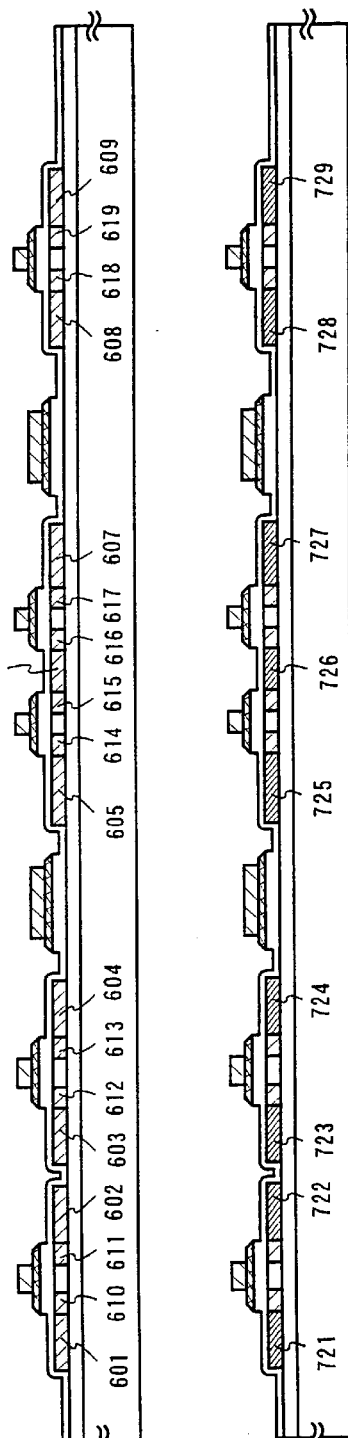

Next, as shown in FIG. 14B, after the resist masks 311a to 311e are removed, the semiconductor film is doped with an n-type impurity element (in the embodiment 7, phosphorus). The step of doping the semiconductor film with the n-type impurity element can be carried out under the same condition as that of the doping step shown in FIG. 3A in the embodiment 1.

In this way, there are formed n-type impurity regions (b) 601 to 609 and n-type impurity regions (c) 610 to 619. Concentrations of the n-type impurity element contained in the n-type impurity regions (b) 601 to 609 and the n-type impurity regions (c) 610 to 619 are same as those in the embodiment 1.

Figure 14C:
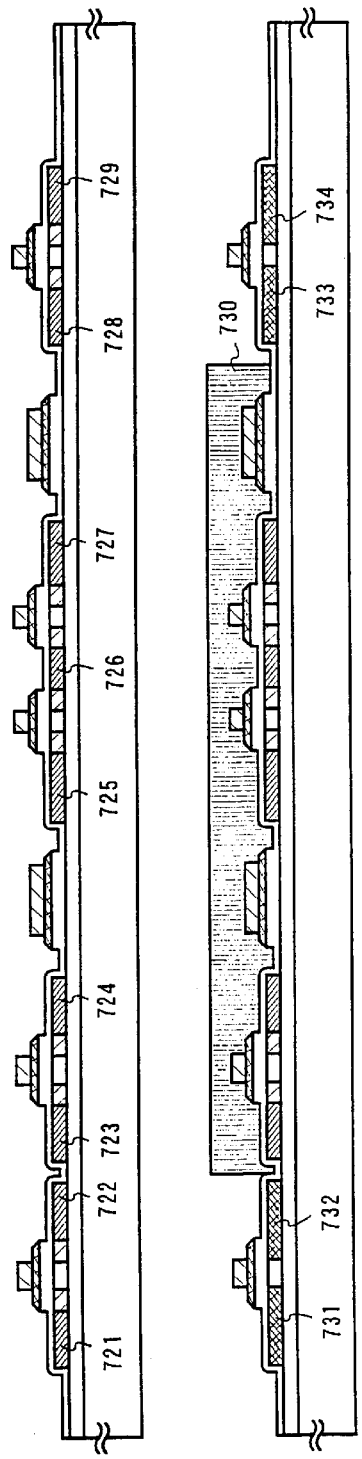

Subsequently, with the gate electrodes 335 to 339 used as masks, the semiconductor film is doped with an n-type impurity element (in the embodiment 6, phosphorus) like the doping step shown in FIG. 2C in the embodiment 1. In this way, there are formed n-type impurity regions (a) 721 to 729. Concentrations of the n-type impurity element contained in the n-type impurity regions (a) 721 to 729 are same as those in the embodiment 1 (FIG. 14C).

Figure 14D:
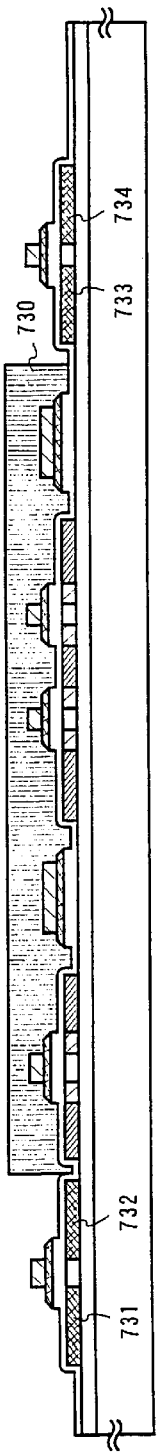

Next, a resist mask 730 is formed, and a p-type impurity element (in the embodiment 6, boron) is added for doping the semiconductor film like the doping step in the embodiment 1 as shown in FIG. 3B. Thus, there are formed p-type impurity regions (a) 731 to 734. Concentrations of the p-type impurity element contained in the p-type impurity regions (a) 731 to 734 are same as those in the embodiment 1 (FIG. 14D).

Thereafter, the EL light emitting device can be manufactured in accordance with the subsequent activation step of the embodiment 1 shown in FIG. 3C and the following steps. Moreover, the structure of the completed TFT is approximately same as that of the embodiment 1, therefore the explanation in the embodiment 1 can be referred to. The constitution according to the embodiment 7 can be embodied with freely combining with any one of the embodiments 1 through 5.

EMBODIMENT 8

While a resin film is used as the interlayer insulation film 375 in the embodiment 1, an insulation film containing silicon, specifically, a silicon oxide film is used in the embodiment 8. After the steps up to FIG. 3B a protection film (in the embodiment 8, a silicon oxynitride film) with a thickness of 100 to 200 nm is first formed so as to cover the gate electrode.

Next, the step of activation is carried out like the step shown in FIG. 3C, and an interlayer insulating film (in the embodiment, a silicon oxide film) with a thickness of 800 nm to 1 $\mu$m is subsequently provided. In the embodiment 8, prior to forming the interlayer insulating film, heat treatment is carried out in an atmosphere containing 3 to 100% hydrogen at 350 to 500° C. for terminating dangling bonds in the active layer with excited hydrogen atoms.

After these steps, there are formed a source wiring and a drain wiring, which are covered by a passivation film. In the embodiment 8, a silicon nitride film or a silicon oxynitride film is used as the passivation film.

The constitution according to the embodiment 8 can be embodied with freely combining with any one of the embodiments 1 through 7.

EMBODIMENT 9

In the embodiment 9, explanation will be made using FIG. 9A and FIG. 9B about an example of sealing an EL light emitting element with a different structure from that of the EL light emitting device shown in FIG. 8A and FIG. 8B in the embodiment 1. The same parts as those shown in FIG. 8A and FIG. 8B are denoted by the same reference numerals.

In the embodiment 9, as a cover material 1101, a plastic film is used with DLC films 1102a and 1102b respectively formed on both faces thereof. When the DLC films are formed on both faces of the plastic film, a roll-to-roll method can be employed, in which the DLC films are formed with the plastic film wound onto a roll.

In the embodiment 9, on a substrate on which the EL element is provided according to the manufacturing steps in the embodiment 1, a cover material 1101 is bonded using a sealing medium 1103. The end of the cover material 1101 is sealed by a sealer 1104. With respect to the sealing medium 1103 and the sealer 1104, the same materials as those presented in the embodiment 1 can be used. As the sealing medium 1103, an inorganic insulating film can be also used.

The constitution according to the embodiment 9 can be embodied with freely combining with any one of the embodiments 1 through 8.

EMBODIMENT 10

In the embodiment 10, an explanation will be made about circuits of the pixels shown in FIG. 5 in the embodiment 1 and in FIG. 11 in the embodiment 5. Here, circuit diagrams corresponding to the structures shown in FIG. 5 and FIG. 11 are shown in FIG. 15A and FIG. 15B, respectively.

Figure 15A:
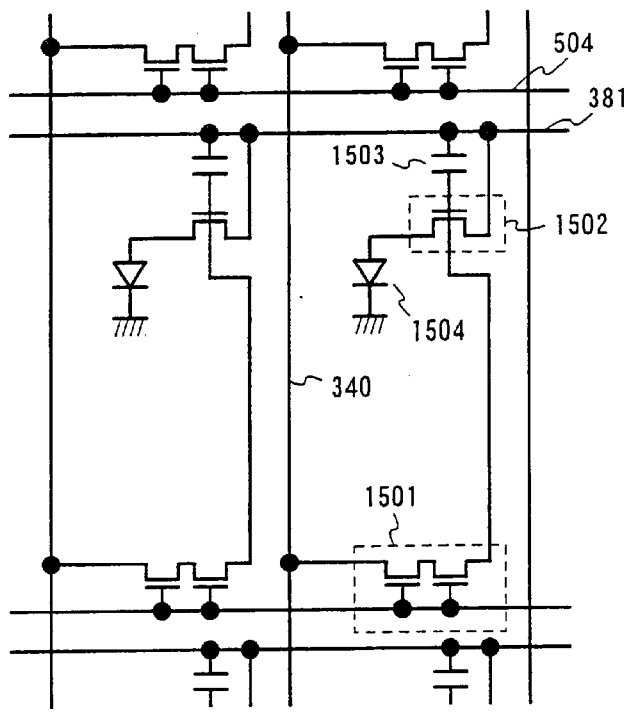
FIG. 15A is a circuit diagram showing a circuit configuration of the pixel shown in FIG. 5 in the embodiment 1.

In FIG. 15A, reference numerals 340, 381, and 504 denote the source wiring, the current supply line, and the gate wiring, respectively. The reference numerals correspond to those in FIG. 5. Furthermore, reference numerals 1501, 1502, 1503, and 1504 denote a switching TFT corresponding to FIG. 6A, a current controlling TFT corresponding to FIG. 6B, a holding capacitor corresponding to FIG. 6C, and an EL element, respectively.

Digital driving of the pixel in the embodiment 10 shown in FIG. 15A can be carried out according to the driving method disclosed in JP-A-2000-114592.

Figure 15B:
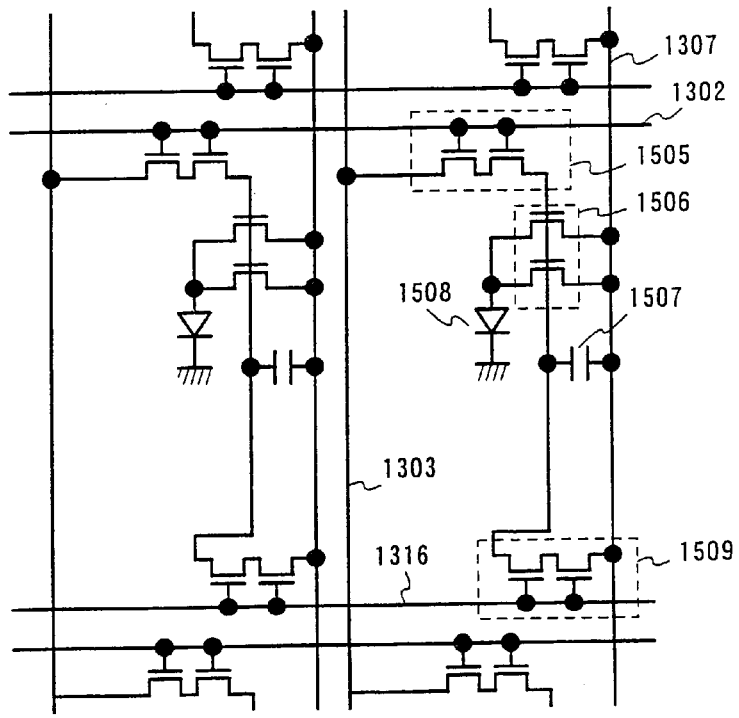
FIG. 15B is a circuit diagram showing a circuit configuration of the pixel shown in FIG. 10 in the embodiment 1.

In FIG. 15B, reference numerals 1303, 1307, and 1302 denote the source wiring, the current supply line, and the gate wiring, respectively. The reference numerals correspond to those in FIG. 11. Furthermore, reference numerals 1505. 1506, 1507, 1508, and 1509 denote a switching TFT corresponding to FIG. H2A, a current controlling TFT corresponding to FIG. 12B, a holding capacitor corresponding to FIG. 12C, an EL element, and an erasing TFT, respectively.

Digital driving of the pixel in the embodiment 10 shown in FIG. 15B can be carried out according to the driving method disclosed in JP-A-11-338786.

The constitution according to the embodiment 10 can be embodied in freely combining with any one of the embodiments 1 through 9.

EMBODIMENT 11

Figure 16:
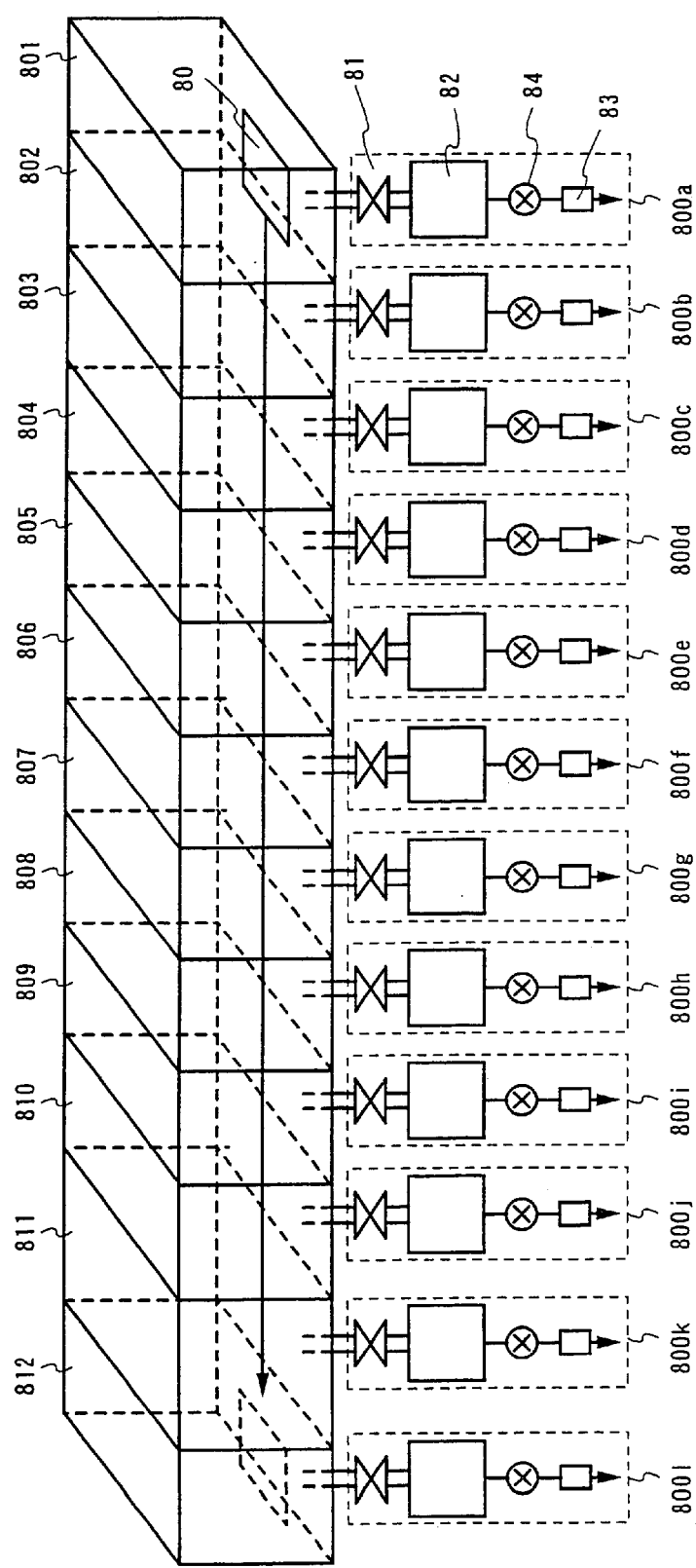
FIG. 16 is a view showing a constitution of an in-line system deposition equipment.

An example of a deposition equipment used for forming the EL element in embodying the present invention is shown in FIG. 16. In the embodiment 11, explanation is made about the case in which the deposition equipment is provided with an in-line system. In FIG. 16, reference numeral 801 denotes a loading chamber from which a substrate is carried. The loading chamber 801 is provided with an evacuating system 800a comprising a first valve 81, a turbo molecular pump 82, a second valve 83, and a rotary pump (an oil sealed rotary vacuum pump) 84.

The first valve 81 is a main valve which sometimes functions as a conductance valve or uses a butterfly valve. The second valve 82 is a fore valve which is first opened for roughly evacuating the loading chamber 801 by the rotary pump 84. Next, the first valve 81 is opened to evacuate the loading chamber 801 to high vacuum by the turbo molecular pump 82. Instead of the turbo molecular pump, a mechanical booster pump or a cryopump can be used. The cryopump is particularly effective for removing water.

Next, reference numeral 802 denotes a pretreatment chamber which treats a surface of the anode or the cathode (in the embodiment 11, anode) of the EL element and is provided with an evacuating system 800b. The pretreatment chamber 802 is closed and isolated from the loading chamber 801 with an unillustrated gate. The pretreatment chamber 802 can be variously changed depending on a process for manufacturing the EL element.

Various pretreatments such as an ozone plasma treatment, an oxygen plasma treatment, an argon plasma treatment, neon plasma treatment, helium plasma treatment and hydrogen plasma treatment, can be carried out . Moreover, with providing a heater, it is possible to carry out heating along with the plasma treatment. Furthermore, an ultraviolet lamp can be effectively provided for allowing ultraviolet irradiation.

In the embodiment 11, the pretreatment is carried out, in which an ozone plasma treatment is carried out to a surface of an anode of an oxide conductive film with heating at 100° C. to remove water and, at the same time, to increase work function on the surface of the anode.

Reference numeral 803 denotes a vapor deposition chamber for depositing an organic material with a vapor deposition method and is referred to as a vapor deposition chamber (A). The vapor deposition chamber (A) 803 is provided with an evacuating system 800c, and is closed and isolated from the pretreatment chamber 802 with an unillustrated gate. In the embodiment 11, a hole injecting layer is formed in the vapor deposition chamber (A) 803.

Reference numeral 804 denotes a vapor deposition chamber for depositing an organic material with a vapor deposition method and is referred to as a vapor deposition chamber (B). The vapor deposition chamber (B) 804 is provided with an evacuating system 800d, and is closed and isolated from the vapor deposition chamber (A) 803 with an unillustrated gate. In the embodiment 11, a hole transport layer is formed in the vapor deposition chamber (B) 804.

Reference numeral 805 denotes a vapor deposition chamber for depositing an organic EL material with a vapor deposition method and is referred to as a vapor deposition chamber (C). The vapor deposition chamber (C) 805 is provided with an evacuating system 800e, and disclosed and isolated from the vapor deposition chamber (B) 804 with an unillustrated gate. In the embodiment 11, a light emitting layer to emit red is formed in the vapor deposition chamber (C) 805.

Reference numeral 806 denotes a vapor deposition chamber for depositing an organic EL material with a vapor deposition method and is referred to as a vapor deposition chamber (D). The vapor deposition chamber (D) 806 is provided with an evacuating system 800f, and is closed and isolated from the vapor deposition chamber (C) 805 with an unillustrated gate. In the embodiment 11, a light emitting layer to emit green light is formed in the vapor deposition chamber (D) 806.

Reference numeral 807 denotes a vapor deposition chamber for depositing an organic EL material with a vapor deposition method and is referred to as a vapor deposition chamber (E). The vapor deposition chamber (E) 807 is provided with an evacuating system 800g, and is closed and isolated from the vapor deposition chamber (D) 806 with an unillustrated gate. In the embodiment 11, a light emitting layer to emit blue light is formed in the vapor deposition chamber (E) 807.

Reference numeral 808 denotes a vapor deposition chamber for depositing an organic material with a vapor deposition method and is referred to as a vapor deposition chamber (F). The vapor deposition chamber (F) 808 is provided with an evacuating system 800h, and is closed and isolated from the vapor deposition chamber (E) 807 with an unillustrated gate. In the embodiment 11, an hole transport layer is formed in the vapor deposition chamber (F) 808.

Reference numeral 809 denotes a vapor deposition chamber for depositing an organic material with a vapor deposition method and is referred to as a vapor deposition chamber (G). The vapor deposition chamber (G) 809 is provided with an evacuating system 800i, and is closed and isolated from the vapor deposition chamber (F) 808 with an unillustrated gate. In the embodiment 11, an hole injecting layer is formed in the vapor deposition chamber (G) 809.

Reference numeral 810 denotes a vapor deposition chamber for depositing a conductive film to become an anode or a cathode of the EL element (in the embodiment 11, a metal film to become a cathode) with a vapor deposition method and is referred to as a vapor deposition chamber (H). The vapor deposition chamber (H) 810 is provided with an evacuating system 800j, and is closed and isolated from the vapor deposition chamber (G) 809 with an unillustrated gate.

In the embodiment 11, an Al—Li alloy film (an alloy film of aluminum and lithium) or an Al—Cs alloy film (an alloy film of aluminum and cesium) is formed in the vapor deposition chamber (H) 810 as a conductive film that becomes a cathode of the EL element. It is also possible to carry out co-vapor-deposition of an element which belongs to group one or two in the periodic table and aluminum.

Reference numeral 811 denotes a sealing chamber which is provided with an evacuating system 800k. The sealing chamber 811 is closed and isolated from the vapor deposition chamber (H) 810 with an unillustrated gate. In the sealing chamber 811, a DLC (diamond-like carbon) film is formed as a passivation film for protecting the EL element against oxygen and water.

For forming the DLC film, a sputtering method or a plasma CVD method can be employed. Since the DLC film can be deposited at temperatures from the room temperatures to 100° C. or below, it is suitably formed as a passivation film for protecting the EL element with low heat resistance. Moreover, the DLC film has high heat conductivity to provide well heat dissipation. Therefore, an effect of preventing the EL element from thermal degradation can be also expected. The DLC film formed in the embodiment 11 is effectively used in being laminated with a silicon nitride film or a silicon carbide film.

Furthermore, fluorine or hydrogen can be added to the DLC film. In addition, by making the oxygen concentration in the DLC film be $1 \times 10^{18}$ atoms/cm$^3$ or below, transmission rate of oxygen can be reduced.

Finally, reference numeral 812 denotes an unloading chamber which is provided with an evacuating system 800l. The substrate formed with the EL element is taken out from the unloading chamber 812.

As described above, use of the deposition equipment shown in FIG. 16 allows the EL element to be free from being exposed to the external air until the EL element is completely sealed, and it becomes possible to manufacture a highly reliable EL display device. In addition, the in-line system allows the EL display device to be manufactured with a high throughput.

Furthermore, each of the treatment chambers, evacuating systems and transport systems in the deposition equipment presented in the embodiment 11 is effectively operated by computer control. In the embodiment 11, a series of treatments is continuously carried out to complete the EL element. Therefore, the computer control can manage through the process from loading of the substrate to taking out of the substrate.

Any of the EL display device presented in the embodiments 1 to 10 can be manufactured using the deposition equipment presented in the embodiment 11.

EMBODIMENT 12

In this embodiment, an external light emitting quantum efficiency can be remarkably improved by using an EL material by which phosphorescence from a triplet exciton can be employed for emitting a light. As a result, the power consumption of the EL element can be reduced, the lifetime of the EL element can be elongated and the weight of the EL element can be lightened.

The following is a report where the external light emitting quantum efficiency is improved by using the triplet exciton (T. Tsutsui. C. Adachi, S. Saito, Photochemical processes in Organized Molecular Systems, ed. K. Honda, (Elsevier Sci. Pub., Tokyo, 1991) p. 437).

The molecular formula of an EL material (coumarin pigment) reported by the above article is represented as follows.
(Chemical Formula 1)
(M. A. Baldo, D. F. O' Brien, Y. You, A. Shoustikov. S. Sibley, M. E. Thompson, S. R. Forrest, Nature 395 (1998) p.151)

The molecular formula of an EL material (Pt complex) reported by the above article is represented as follows.
(Chemical Formula 2)
(M. A. Baldo, S. Lamansky, P. E. Burrows, M. E. Tnompson, S. R. Forrest, Appl. Phys. Lett., 75 (1999) p.4.)
(T. Tsutsui, M. -J. Yang, M. Yahiro, K. Nakamura, T. Watanabe, T. Tsuji, Y Fukuda, T. Wakimoto, S. Mayaguchi, Jpn, Appl. Phys., 38 (12B) (1999) L1502)

The molecular formula of an EL material (Ir complex) reported by the above article is represented as follows.
(Chemical Formula 3)

As described above, if phosphorescence from a triplet exciton can be put to practical use, it can realize the external light emitting quantum efficiency three to four times as high as that in the case of using fluorescence irom a singlet exciton in principle. The structure according to this embodiment can be freely implemented in combination of any structures of the first to eleventh embodiments.

EMBODIMENT 13

In the embodiment 13, explanation will be made using FIG. 17A to FIG. 17F about specific examples of the EL element 387 shown in FIG. 4B in the embodiment 1. FIGS. 17A to 17F are enlarged views which shows examples of structures of the EL elements each corresponding to a part of the EL element 387 in FIG. 4B. Each of the examples is formed in the deposition equipment shown in FIG. 16. As materials used for forming EL layers in the embodiment 13, known organic materials or inorganic materials can be used. Both high-molecular material and low-molecular material can be used.

Figure 17A:
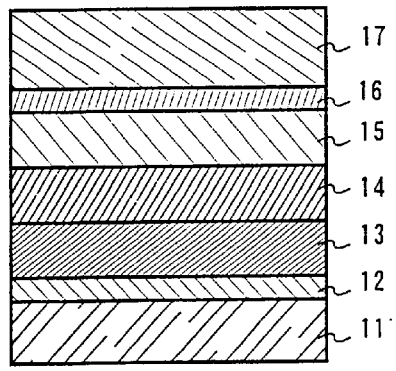
FIG. 17A to FIG. 17F are enlarged partial cross sectional views each showing an example of the structure of the EL element shown in FIG. 4B.

First, FIG. 17A shows an example of an EL element with a structure in which a hole injecting layer 12, a hole transport layer 13, a light emitting layer 14, an electron transport layer 15, an electron injecting layer 16, and a cathode 17 are laminated on an anode (pixel electrode) 11. With respect to the light emitting layer 14, three kinds of light emitting layers respectively corresponding to red, green and blue can be deposited.

In the example, surface refinement of the anode 11 is carried out in the pretreatment chamber 802, the hole injecting layer 12 is formed in the vapor deposition chamber (A) 803, the hole transport layer 13 is formed in the vapor deposition chamber (B) 804, the light emitting layer 14 is formed in the vapor deposition chamber (C) 805 through the vapor deposition chamber (E) 807, the electron transport layer 15 is formed in the vapor deposition chamber (F) 808, the electron injecting layer 16 is formed in the vapor deposition chamber (G)809, and the cathode 17 is formed in the vapor deposition chamber (H) 810.

Figure 17B:
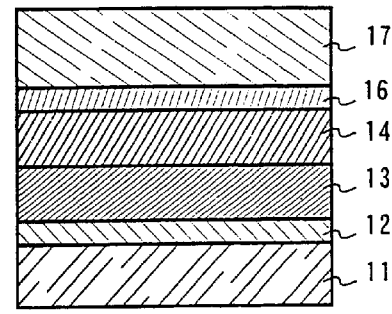

Next, FIG. 17B shows an example of an EL element with a structure in which the hole injecting layer 12, the hole transport layer 13, the light emitting layer 14, the electron injecting layer 16, and the cathode 17 are laminated on the anode (pixel electrode) 11. With respect to the light emitting layer 14, three kinds of light emitting layers respectively corresponding to red, green and blue can be deposited.

In the example, surface refinement of the anode 11 is carried out in the pretreatment chamber 802, the hole injecting layer 12 is formed in the vapor deposition chamber (A) 803, the hole transport layer 13 is formed in the vapor deposition chamber (B) 804, the light emitting layer 14 is formed in the vapor deposition chamber (C) 805 through the vapor deposition chamber (E) 807, the substrate is made to pass through the vapor deposition chamber (F) 808, the electron injecting layer 16 is then formed in the vapor deposition chamber (G)809, and the cathode 17 is formed in the vapor deposition chamber (H) 810.

Figure 17C:
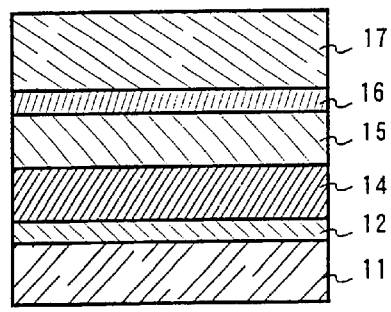

Then, FIG. 17C shows an example of an EL element with a structure in which the hole injecting layer 12, the light emitting layer 14, the electron transport layer 15, the electron injecting layer 16, and the cathode 17 are laminated on the anode (pixel electrode) 11. With respect to the light emitting layer 14, three kinds of light emitting layers respectively corresponding to red, green and blue can be deposited.

In the example, surface refinement of the anode 11 is carried out in the pretreatment chamber 802, the hole injecting layer 12 is formed in the vapor deposition chamber (A) 803, the substrate is made to pass through the vapor deposition chamber (B) 804, the light emitting layer 14 is then formed in the vapor deposition chamber (C) 805 through the vapor deposition chamber (E) 807, the electron transport layer 15 is formed in the vapor deposition chamber (F) 808, the electron injecting layer 16 is formed in the vapor deposition chamber (G)809, and the cathode 17 is formed in the vapor deposition chamber (H) 810.

Figure 17D:
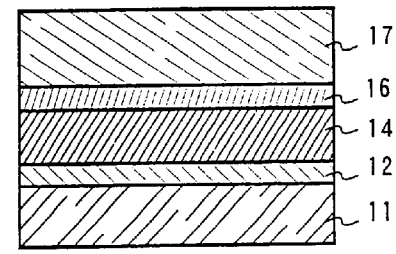

FIG. 17D shows an example of an EL element with a structure in which the hole injecting layer 12, the light emitting layer 14, the electron injecting layer 16, and the cathode 17 are laminated on the anode (pixel electrode) 11. With respect to the light emitting layer 14, three kinds of light emitting layers respectively corresponding to red, green and blue can be deposited.

In the example, surface refinement of the anode 11 is carried out in the pretreatment chamber 802, the hole injecting layer 12 is formed in the vapor deposition chamber (A) 803, with the substrate is made to pass through the vapor deposition chamber (B) 804, the light emitting layer 14 is formed in the vapor deposition chamber (C) 805 through the vapor deposition chamber (E) 807, the substrate is made to pass through the vapor deposition chamber (F) 808, the electron injecting layer 16 is then formed in the vapor deposition chamber (G)809, and the cathode 17 is formed in the vapor deposition chamber (H) 810.

Figure 17E:
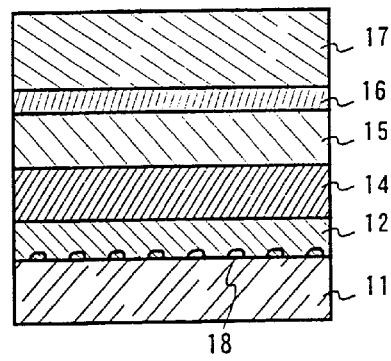

Next, FIG. 17E shows an example of an EL with has a structure in which a group of clusters 18, the hole injecting layer 12, the light emitting layer 14, the electron transport layer 15, the electron injecting layer 16, and the cathode 17 are laminated on the anode (pixel electrode) 11. With respect to the light emitting layer 14, three kinds of light emitting layers respectively corresponding to red, green and blue can be deposited. The cluster 18 is provided for increasing the work function of the anode 11, and iridium, nickel, or platinum is provided in clustered (in mass like) in the example.

In the example, surface refinement of the anode 11 is carried out in the pretreatment chamber 802, the clusters 18 are formed in the vapor deposition chamber (A) 803, the hole injecting layer 12 is formed in the vapor deposition chamber (B) 804, the light emitting layer 14 is formed in the vapor deposition chamber (C) 805 through the vapor deposition chamber (E) 807, the electron transport layer 15 is formed in the vapor deposition chamber (F) 808, the electron injecting layer 16 is formed in the vapor deposition chamber (G)809, and the cathode 17 is formed in the vapor deposition chamber (H) 810.

Figure 17F:
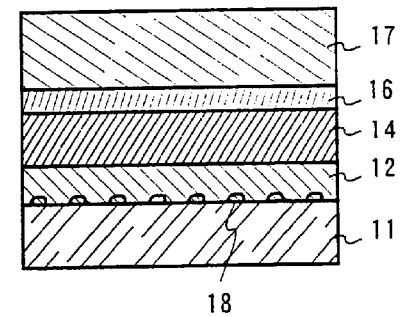

FIG. 17F shows an example of an EL element with a structure in which a group of clusters 18, the hole injecting layer 12, the light emitting layer 14, the electron injecting layer 16, and the cathode 17 are laminated on the anode (pixel electrode) 11. With respect to the light emitting layer 14, three kinds of light emitting layers respectively corresponding to red, green and blue can be deposited.

In the example, surface refinement of the anode 11 is carried out in the pretreatment chamber 802, the clusters 18 are formed in the vapor deposition chamber (A) 803, the hole injecting layer 12 is formed in the vapor deposition chamber (B) 804, the light emitting layer 14 is formed in the vapor deposition chamber (C) 805 through the vapor deposition chamber (E) 807, with the substrate is made to pass through the vapor deposition chamber (F) 808, the electron injecting layer 16 is then formed in the vapor deposition chamber (G)809, and the cathode 17 is formed in the vapor deposition chamber (H) 810.

As explained in the foregoing, even for forming EL elements with various kinds of structures, the use of the deposition equipment as shown in FIG. 16 allows to facilitate manufacturing such various kinds of EL elements. The constitution according to the embodiment 13 can be embodied with freely combining with any one of the embodiments 1 through 12.

EMBODIMENT 14

The light emitting apparatus formed according to the present invention, is a self light emitting type, therefore compared to a liquid crystal display device, it has excellent visible properties and is broad in an angle of visibility. Accordingly, it may be used as a display portion of various electric devices. In such a case, since the light emitting apparatus of this invention is a passive type light emitting device but may have a large size screen by decreasing the wiring resistance, it may be used in various situations.

As other electronic equipments of the present invention there are: a video camera; a digital camera; a goggle type display (head mounted display); a car navigation system; a car audio stereo; a notebook type personal computer; a game apparatus; a portable information terminal (such as a mobile computer, a portable telephone, a portable game machine, or an electronic book); and an image playback device equipped with a recording medium (specifically, device provided with a display portion which plays back images in a recording medium such as a compact disc player (CD), a laser disk player (LD), or a digital versatile disk Player (DVD), and displays the images). Specific examples of those electronic equipments are shown in FIGS. 18A to 19B.

Figure 18A:
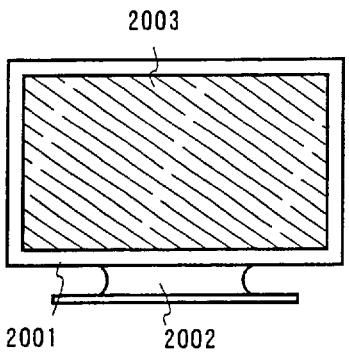
FIG. 18A to FIG. 18F are views showing examples of electronic appliances.

FIG. 18A shows an EL display containing a casing 2001, a support stand 2002, and a display portion 2003. The light emitting device of the present invention can be used as the display portion 2003. Such an EL display is a self light emitting type so that a back light is not necessary. Thus, the display portion can be made thinner than that of a liquid crystal display.

Figure 18B:
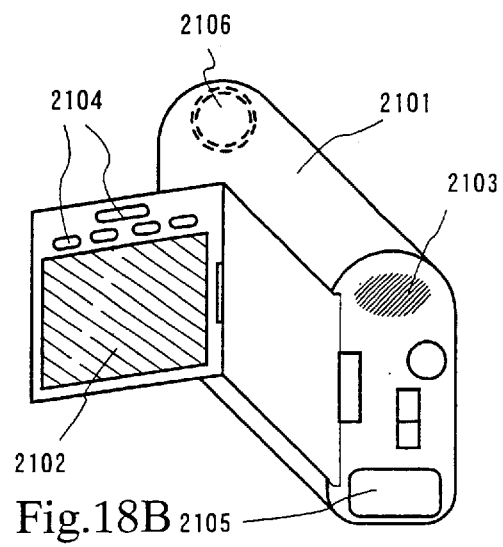

FIG. 18B shows a video camera, and contains a main body 2101, a display portion 2102, a sound input portion 2103, operation switches 2104, a battery 2105, and an image receiving portion 2106. The light emitting device of the present invention can be used as the display portion 2102.

Figure 18C:
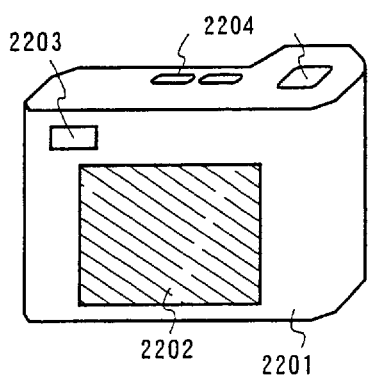

FIG. 18C shows a digital camera, and contains a main body 2201, a display portion 2202, an eye piece portion 2203, and operation switches 2204. The light emitting device of the present invention can be used as the display portion 2202.

Figure 18D:
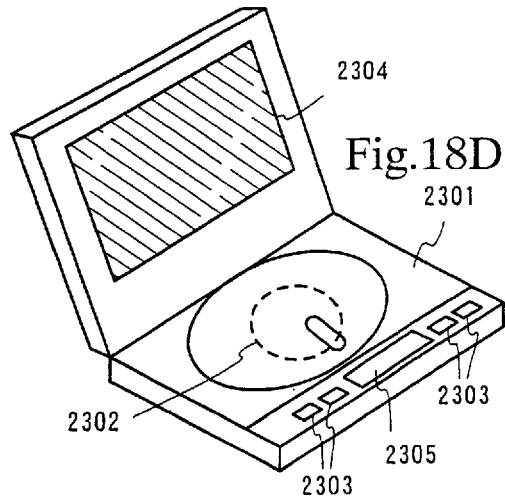

FIG. 18D is an image playback device equipped with a recording medium (specifically, a DVD playback device), and contains a main body 2301, a recording medium (such as a CD, LD or DVD) 2302, operation switches 2303, a display portion (a) 2304, and a display portion (b) 2305. The display portion (a) 2304 is mainly used for displaying image information. The display portion (b) 2305 is mainly used for displaying character information. The light emitting device of the present invention can be used as the display portion (a) 2304 and as the display portion (b) 2305. Note that the image playback device equipped with the recording medium includes devices such as CD playback devices and game machines.

Figure 18E:
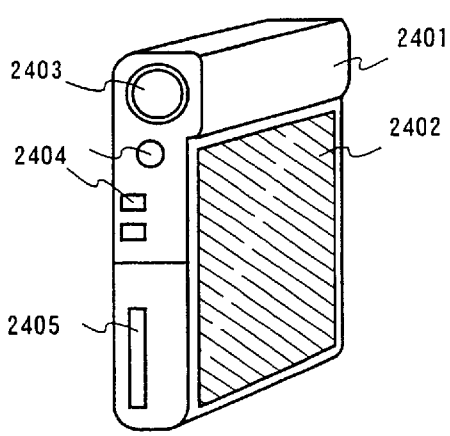

FIG. 18E shows a portable (mobile) computer, and contains a main body 2401, a camera portion 2402, an image receiving portion 2403, operation switches 2404, and a memory slot 2405. The electro-optical device of the present invention can be used as the display portion 2402. This portable computer can record or play back information in the recording medium which is an accumulation of flash memory or involatile memory.

Figure 18F:
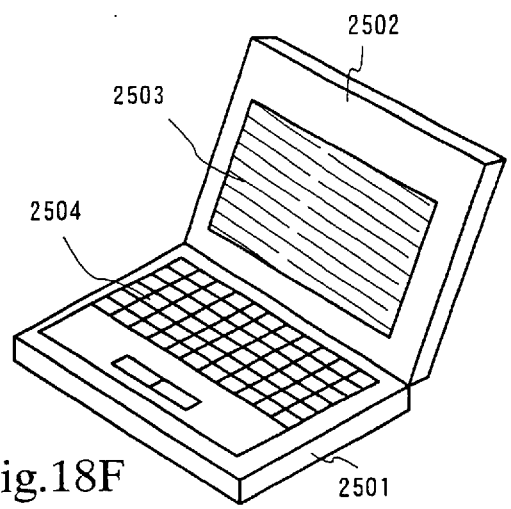

FIG. 18F is a personal computer, and contains a main body 2501, a casing 2502, a display portion 2503, and a keyboard 2504. The light emitting device of the present invention can be used as the display portion 2503.

Note that if the luminance of EL material increases in the future, then it will become possible to use the light emitting device of the present invention in a front type or a rear type projector by expanding and projecting light containing output image information with a lens or the like.

Further, the above electric devices display often information transmitted through an electronic communication circuit such as the Internet and CATV (cable tv), and particularly situations of displaying moving images is increasing. The response speed of EL materials is so high that the above electric devices are good for display of moving image.

In addition, since the light emitting device conserves power in the light emitting portion, it is preferable to display information so as to make the light emitting portion as small as possible. Consequently, when using the light emitting device in a display portion mainly for character information, such as in a portable information terminal, in particular a portable telephone or a car audio stereo, it is preferable to drive the light emitting device so as to form character information by the light emitting portions while non-light emitting portions are set as background.

Figure 19A:
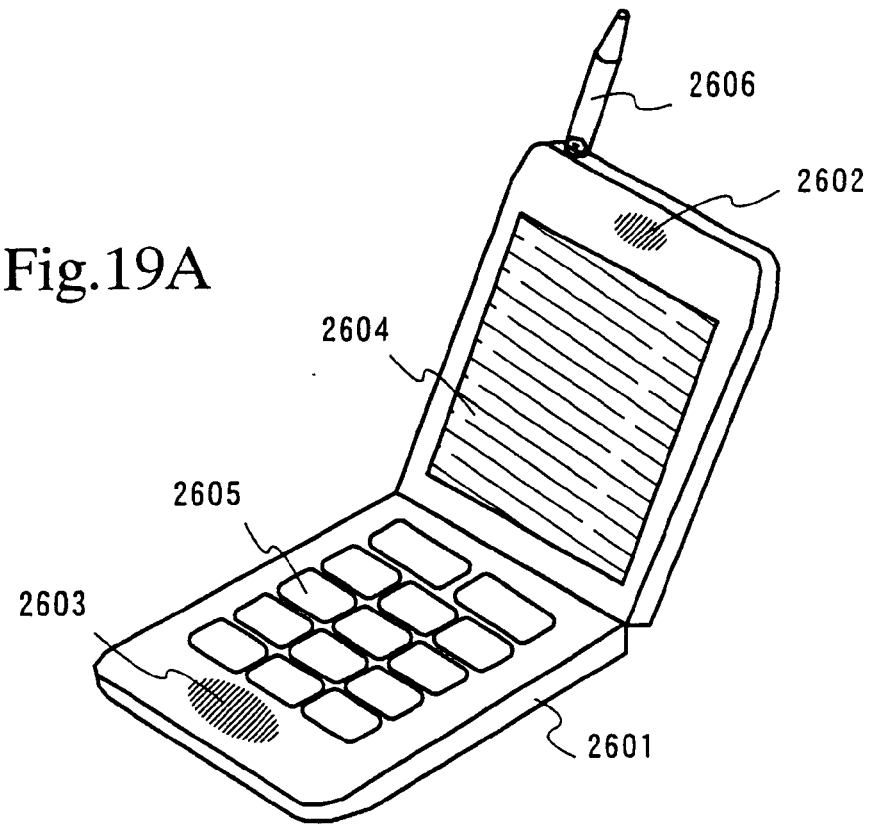
FIG. 19A and FIG. 19B are views showing examples of electronic appliances.

FIG. 19A shows a portable telephone, and contains a main body 2601, a sound output portion 2602, a sound input portion 2603, a display portion 2604, operation switches 2605, and an antenna 2606. The light emitting device of the present invention can be used as the display portion 2604. Note that by displaying white color characters in a black color background, the display portion 2604 can suppress the power consumption of the portable telephone.

Figure 19B:
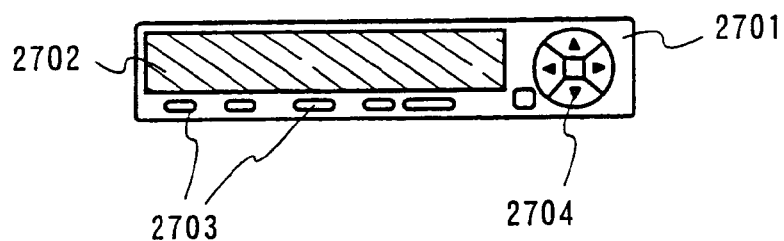

FIG. 19B shows a car audio stereo, and contains a main body 2701, a display portion 2702, and operation switches 2703 and 2704. The light emitting device of the present invention can be used as the display portion 2702. Further, a car mounting audio stereo is shown in this embodiment, but a fixed type audio playback device may also be used. Note that, by displaying white color characters in a black color background, the display portion 2704 can suppress the power consumption.

As described above, the application range of this invention is extremely wide, and it may be used for electric devices in various fields. Further, the electric device of this embodiment may be obtained by using a light emitting device freely combining the structures of the first to thirteenth embodiments.

According to the present invention, a TFT can be manufactured with a manufacturing process which has photolithography steps reduced, and the yield of an active matrix type light emitting device using the TFT can be improved. In addition, the manufacturing term of the light emitting device is to be shortened to reduce manufacturing cost to thereby allow to provide an inexpensive light emitting device. Furthermore, use of the light emitting device thus made inexpensive makes it possible to provide an inexpensive electronic appliance.

While the present invention has been particularly shown and described with reference to preferred embodiments thereof, it will be understood by those skilled in the art that the foregoing and other changes in form and details can be made therein without departing from the spirit and scope of the present invention.

What is claimed is:

1. A method for fabricating a light emitting device comprising:
   a first step of forming a semiconductor film over an insulation body;
   a second step of forming a first insulation film which covers the semiconductor film;
   a third step of forming laminated conductive films over the first insulation film;
   a fourth step of forming a gate electrode by etching the laminated conductive films;
   a fifth step of doping a first n-type impurity element into the semiconductor film using the gate electrode as a mask;
   a sixth step of selectively etching a part of the gate electrode to form a single-layer portion of the gate electrode after a side surface of the gate electrode is etched;
   a seventh step of doping a second n-type impurity element into the semiconductor film using a portion of the gate electrode having the laminated conductive films as a mask while allowing the second n-type impurity element to pass through the single-layer portion of the gate electrode;
   an eighth step of forming a second insulation film which covers the gate electrode;
   a ninth step of forming a wiring which is brought into contact with the semiconductor film over the second insulation film;
   a tenth step of forming a light emitting element over the second insulation film; and
   an eleventh step of forming a passivation film over the light emitting element.

2. A method according to claim 1, wherein the laminated conductive films are formed by laminating a tungsten film or an aluminum alloy film over a tantalum nitride film or a titanium nitride film.

3. A method according to claim 1, wherein the second insulation film comprises at least one selected from the group consisting of a silicon nitride film, a silicon nitride-oxide film and a resin film.

4. A method according to claim 1, wherein the passivation film includes at least one selected from the group consisting of a carbon film, a silicon nitride film and a silicon nitride-oxide film.

5. A method according to claim 1, wherein an outermost surface of the wiring is made of a metal film including at least an element which belongs to Group 1 or Group 2 of the periodic table or a bismuth film.

6. A method according to claim 1, wherein the gate electrode formed in the fourth step has a tapered shape.

7. A method for fabricating a light emitting device comprising:
- a first step of forming a semiconductor film over an insulation body;
- a second step of forming a first insulation film which covers the semiconductor film;
- a third step of forming a first conductive film and a second conductive film over the first insulation film;
- a fourth step of forming a first gate electrode made of the first conductive film and a second gate electrode made of the second conductive film by etching the first conductive film and the second conductive film;
- a fifth step of doping a first n-type impurity element into the semiconductor film using the first gate electrode and the second gate electrode as masks;
- a sixth step of etching the first gate electrode and the second gate electrode to narrow a line width thereof and thereafter selectively etching a part of the second gate electrode to form a portion non-laminated by the second gate electrode of the first gate electrode;
- a seventh step of doping a second n-type impurity element into the semiconductor film using the second gate electrode as a mask after completing the sixth step while allowing the second n-type impurity element to pass through the portion non-laminated by the second gate electrode of the first gate electrode;
- an eighth step of forming a second insulation film which covers the first gate electrode and second gate electrode;
- a ninth step of forming a wiring which is brought into contact with the semiconductor film over the second insulation film;
- a tenth step of forming a light emitting element over the second insulation film; and
- an eleventh step of forming a passivation film over the light emitting element.

8. A method according to claim 7, wherein a tantalum nitride film or a titanium nitride film is used as the first conductive film and a tungsten film or an aluminum alloy film is used as the second conductive film.

9. A method according to claim 7, wherein the first gate electrode and the second gate electrode formed in the fourth step have a tapered shape.

10. A method according to claim 7, wherein the second insulation film comprises at least one selected from the group consisting of a silicon nitride film, a silicon nitride-oxide film and a resin film.

11. A method according to claim 7, wherein the passivation film includes at least one selected from the group consisting of a carbon film, a silicon nitride film and a silicon nitride-oxide film.

12. A method according to claim 7, wherein an outermost surface of the wiring is made of a metal film including at least an element which belongs to Group 1 or Group 2 of the periodic table or a bismuth film.

13. A method according to claim 1 wherein said light emitting device is incorporated into at least one of a video camera, a digital camera, an image playback device, a portable computer, a personal computer, a portable telephone and a car audio stereo.

14. A method according to claim 7 wherein said light emitting device is incorporated into at least one of a video camera, a digital camera, an image playback device, a portable computer, a personal computer, a portable telephone and a car audio stereo.

15. A method for fabricating a light emitting device comprising:
- forming a semiconductor film over an insulation body;
- forming a first insulation film which covers the semiconductor film;
- forming laminated conductive films over the first insulation film;
- forming a gate electrode by etching the laminated conductive films;
- doping a first n-type impurity element into the semiconductor film using the gate electrode as a mask;
- selectively etching a part of the gate electrode to form a single-layer portion of the gate electrode after a side surface of the gate electrode is etched;
- doping a second n-type impurity element into the semiconductor film using a portion of the gate electrode having the laminated conductive films as a mask while allowing the second n-type impurity element to pass through the single-layer portion of the gate electrode;
- forming a second insulation film which covers the gate electrode;
- forming a wiring which is brought into contact with the semiconductor film over the second insulation film;
- forming a light emitting element over the second insulation film; and
- forming a passivation film over the light emitting element.

16. A method according to claim 15, wherein the laminated conductive films are formed by laminating a tungsten film or an aluminum alloy film over a tantalum nitride film or a titanium nitride film.

17. A method according to claim 15, wherein the second insulation film comprises at least one selected from the group consisting of a silicon nitride film, a silicon nitride-oxide film and a resin film.

18. A method according to claim 15, wherein the passivation film includes at least one selected from the group consisting of a carbon film, a silicon nitride film and a silicon nitride-oxide film.

19. A method according to claim 15, wherein an outermost surface of the wiring is made of a metal film including at least an element which belongs to Group 1 or Group 2 of the periodic table or a bismuth film.

20. A method according to claim 15, wherein the etching of the laminated conductive films is performed so that the gate electrode has a tapered shape.

21. A method for fabricating a light emitting device comprising:

forming a semiconductor film over an insulation body;

forming a first insulation film which covers the semiconductor film;

forming a first conductive film and a second conductive film over the first insulation film;

forming a first gate electrode made of the first conductive film and a second gate electrode made of the second conductive film by etching the first conductive film and the second conductive film;

doping a first n-type impurity element into the semiconductor film using the first gate electrode and the second gate electrode as masks;

etching the first gate electrode and the second gate electrode to narrow a line width thereof and thereafter selectively etching a part of the second gate electrode to form a portion non-laminated by the second gate electrode of the first gate electrode;

doping a second n-type impurity element into the semiconductor film using the second gate electrode as a mask while allowing the second n-type impurity element to pass through the portion on-laminated by the second gate electrode of the first gate electrode;

forming a second insulation film which covers the first gate electrode and second gate electrode;

forming a wiring which is brought into contact with the semiconductor film over the second insulation film;

forming a light emitting element over the second insulation film; and forming a passivation film over the light emitting element.

22. A method according to claim 21, wherein a tantalum nitride film or a titanium nitride film is used as the first conductive film and a tungsten film or an aluminum alloy film is used as the second conductive film.

23. A method according to claim 21, wherein the second insulation film comprises at least one selected from the group consisting of a silicon nitride film, a silicon nitride-oxide film and a resin film.

24. A method according to claim 21, herein the passivation film includes at least one selected from the group consisting of a carbon film, a silicon nitride film and a silicon nitride-oxide film.

25. A method according to claim 21, wherein an outermost surface of the wiring is made of a metal film including at least an element which belongs to Group 1 or Group 2 of the periodic table or a bismuth film.

26. A method according to claim 21, wherein the etching of the laminated conductive films is performed so that the gate electrode has a tapered shape.

27. A method for fabricating a light emitting device comprising:

forming a semiconductor film over an insulation body;

forming an insulation film which covers the semiconductor film;

forming laminated conductive films over the insulation film;

forming a gate electrode by etching the laminated conductive films;

doping a first n-type impurity element into the semiconductor film using the gate electrode as a mask;

selectively etching a part of the gate electrode to form a single-layer portion of the gate electrode after a side surface of the gate electrode is etched;

doping a second n-type impurity element into the semiconductor film using a portion of the gate electrode having the laminated conductive films as a mask while allowing the second n-type impurity element to pass through the single-layer portion of the gate electrode.

28. A method according to claim 27, wherein the laminated conductive films are formed by laminating a tungsten film or an aluminum alloy film over a tantalum nitride film or a titanium nitride film.

29. A method according to claim 27, wherein the etching of the laminated conductive films is performed so that the gate electrode has a tapered shape.

30. A method for fabricating a light emitting device comprising:

foming a semiconductor film over an insulation body;

forming an insulation film which covers the semiconductor film;

forming a first conductive film and a second conductive film over the insulation film;

forming a first gate electrode made of the first conductive film and a second gate electrode made of the second conductive film by etching the first conductive film and the second conductive film;

doping a first n-type impurity element into the semiconductor film using the first gate electrode and the second gate electrode as masks;

etching the first gate electrode and the second gate electrode to narrow a line width thereof and thereafter selectively etching a part of the second gate electrode to form a portion non-laminated by the second gate electrode of the first gate electrode;

doping a second n-type impurity element into the semiconductor film using the second gate electrode as a mask while allowing the second n-type impurity element to pass through the portion non-laminated by the second gate electrode of the first gate electrode.

31. A method according to claim 30, wherein a tantalum nitride film or a titanium nitride film is used as the first conductive film and a tungsten film or an aluminum alloy film is used as the second conductive film.

32. A method according to claim 30, wherein the etching of the laminated conductive films is performed so that the gate electrode has a tapered shape.

33. A method for fabricating a light emitting device comprising:

forming a semiconductor film over an insulation body;

forming a first insulation film which covers the semiconductor film;

forming laminated conductive films over the first insulation film;

forming a gate electrode by etching the laminated conductive films;

doping a first n-type impurity element into the semiconductor film using the gate electrode as a mask;

selectively etching a part of the gate electrode to form a single-layer portion of the gate electrode;

doping a second n-type impurity element into the semiconductor film using a portion of the gate electrode having the laminated conductive films as a mask while allowing the second n-type impurity element to pass through the single-layer portion of the gate electrode;

forming a second insulation film which covers the gate electrode;

forming a wiring which is brought into contact with the semiconductor film over the second insulation film;

forming a light emitting element over the second insulation film; and forming a passivation film over the light emitting element.

34. A method according to claim 33, wherein the laminated conductive films are formed by laminating a tungsten film or an aluminum alloy film over a tantalum nitride film or a titanium nitride film.

35. A method according to claim 33, wherein the second insulation film comprises at least one selected from the group consisting of a silicon nitride film, a silicon nitride-oxide film and a resin film.

36. A method according to claim 33, wherein the passivation film includes at least one selected from the group consisting of a carbon film, a silicon nitride film and a silicon nitride-oxide film.

37. A method according to clam 33, wherein an outermost surface of the wiring is made of a metal film including at least an element which belongs to Group 1 or Group 2 of the periodic table or a bismuth film.

38. A method according to claim 33, wherein the etching of the laminated conductive films is performed so that the gate electrode has a tapered shape.

39. A method for fabricating a light emitting device comprising:
   forming a semiconductor film over an insulation body;
   forming a first insulation film which covers the semiconductor film;
   forming a first conductive film and a second conductive film over the first insulation film;
   forming a first gate electrode made of the first conductive film and a second gate electrode made of the second conductive film by etching the first conductive film and the second conductive film;
   doping a first n-type impurity element into the semiconductor film using the first gate electrode and the second gate electrode as masks;
   selectively etching a part of the second gate electrode to form a portion non-laminated by the second gate electrode of the first gate electrode;
   doping a second n-type impurity element into the semiconductor film using the second gate electrode as a mask while allowing the second n-type impurity element to pass through the portion non-laminated by the second gate electrode of the first gate electrode;
   forming a second insulation film which covers the first gate electrode and second gate electrode;
   forming a wiring which is brought into contact with the semiconductor film over the second insulation film;
   forming a light emitting element over the second insulation film; and
   forming a passivation film over the light emitting element.

40. A method according to claim 39, wherein a tantalum nitride film or a titanium nitride film is used as the first conductive film and a tungsten film or an aluminum alloy film is used as the second conductive film.

41. A method according to claim 39, wherein the second insulation film comprises at least one selected from the group consisting of a silicon nitride film, a silicon nitride-oxide film and a resin film.

42. A method according to claim 39, wherein the passivation film includes at least one selected from the group consisting of a carbon film, a silicon nitride film and a silicon nitride-oxide film.

43. A method according to claim 39, wherein an outermost surface of the wiring is made of a metal film including at least an element which belongs to Group 1 or Group 2 of the periodic table or a bismuth film.

44. A method according to claim 39, wherein the etching of the laminated conductive films is performed so that the gate electrode has a tapered shape.

* * * * *